(12) United States Patent
Bao et al.

(10) Patent No.: US 11,177,435 B2
(45) Date of Patent: Nov. 16, 2021

(54) CROSS-POINT MEMORY-SELECTOR COMPOSITE PILLAR STACK STRUCTURES AND METHODS OF FORMING THE SAME

(71) Applicant: Taiwan Semiconductor Manufacturing Company Limited, Hsinchu (TW)

(72) Inventors: Xinyu Bao, Fremont, CA (US); Hon-Sum Philip Wong, Stanford, CA (US)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 104 days.

(21) Appl. No.: 16/785,058

(22) Filed: Feb. 7, 2020

(65) Prior Publication Data

US 2021/0249596 A1 Aug. 12, 2021

(51) Int. Cl.
*H01L 45/00* (2006.01)
*H01L 27/24* (2006.01)

(52) U.S. Cl.
CPC ........ *H01L 45/124* (2013.01); *H01L 27/2481* (2013.01); *H01L 45/06* (2013.01); *H01L 45/08* (2013.01); *H01L 45/14* (2013.01); *H01L 45/1608* (2013.01); *H01L 45/1675* (2013.01)

(58) Field of Classification Search
CPC ... H01L 45/124; H01L 45/1675; H01L 45/08; H01L 27/2481; H01L 45/14; H01L 45/1608; H01L 45/06
See application file for complete search history.

(56) References Cited

U.S. PATENT DOCUMENTS

2021/0091307 A1* 3/2021 BrightSky ........... H01L 45/1246

* cited by examiner

*Primary Examiner* — David Vu
(74) *Attorney, Agent, or Firm* — The Marbury Law Group, PLLC

(57) ABSTRACT

A via-level dielectric material layer is formed over a first dielectric material layer embedding a first conductive structure. A via cavity is formed through the via-level dielectric material layer. A least one straight sidewall vertically extends from a closed upper periphery of the via cavity at a top surface of the via-level dielectric material layer to a closed lower periphery of the via cavity that is adjoined to a top surface of the first conductive structure. A pillar stack structure is formed in the via cavity by sequentially forming a set of material portions containing a lower pillar structure and an upper pillar structure. The lower pillar structure and the upper pillar structure include a selector material pillar and a memory material pillar. A second conductive structure may be formed on a top surface of the pillar stack structure. The pillar stack structure may be used in an array configuration.

20 Claims, 21 Drawing Sheets

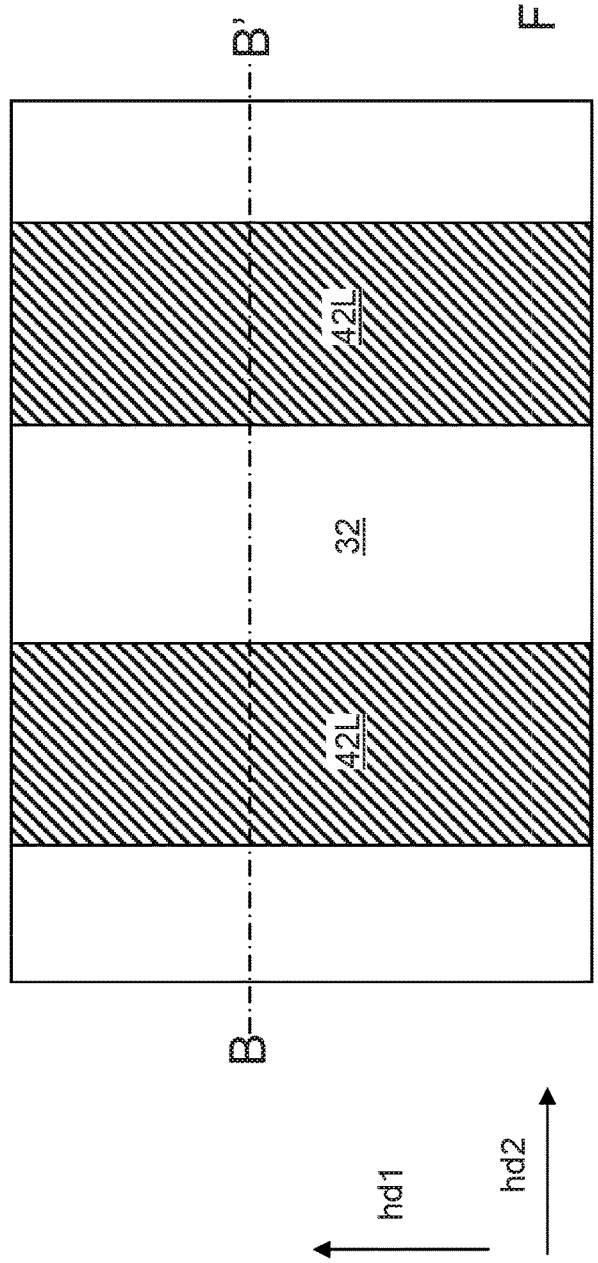

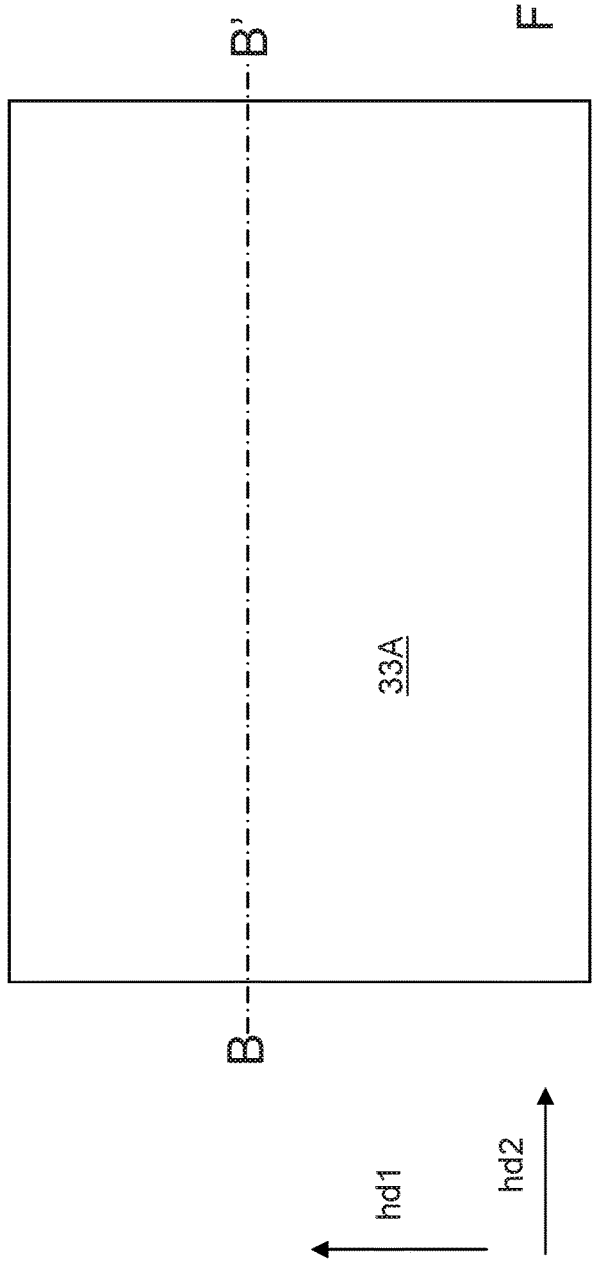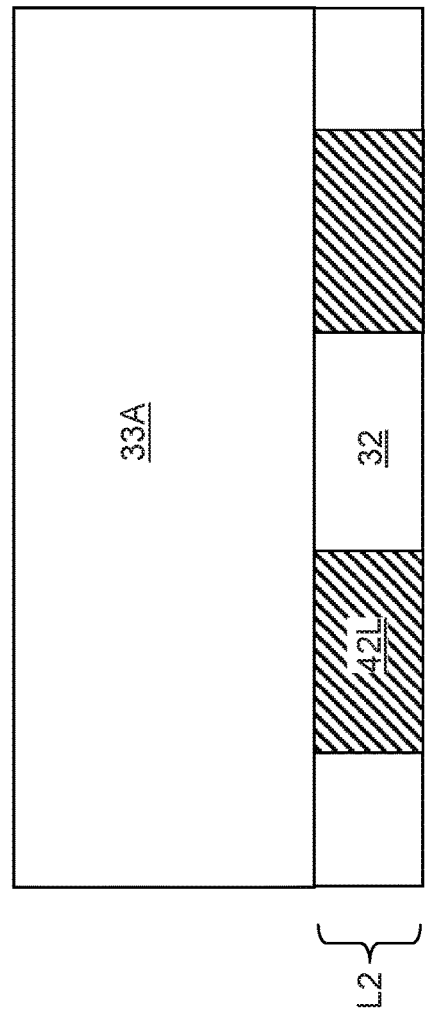

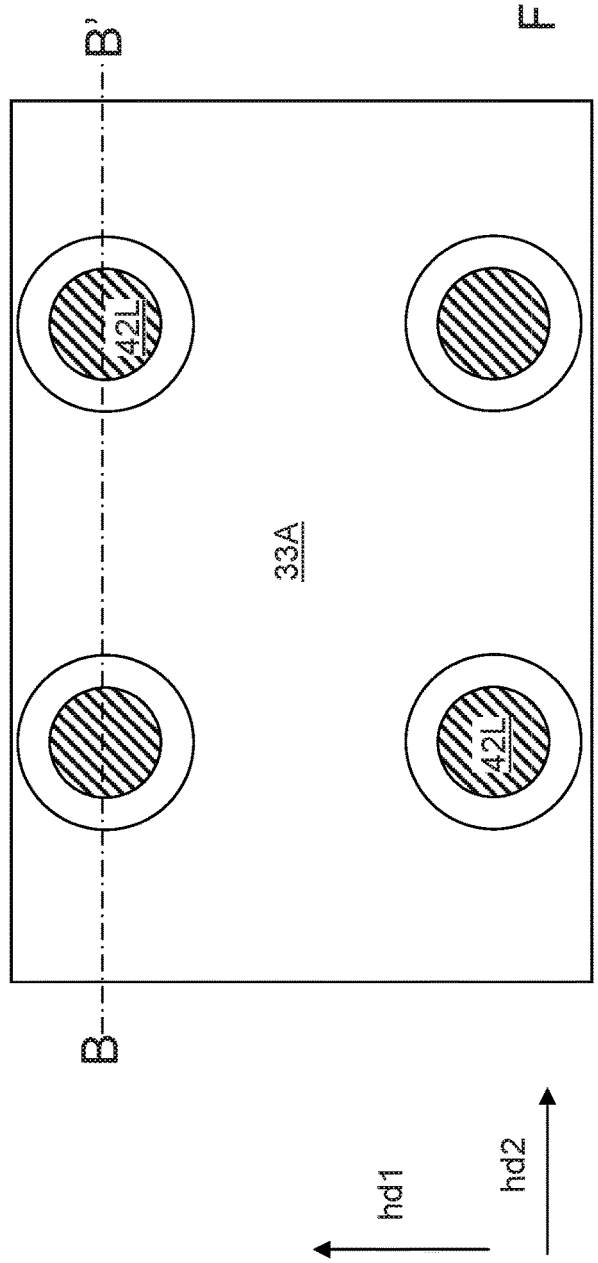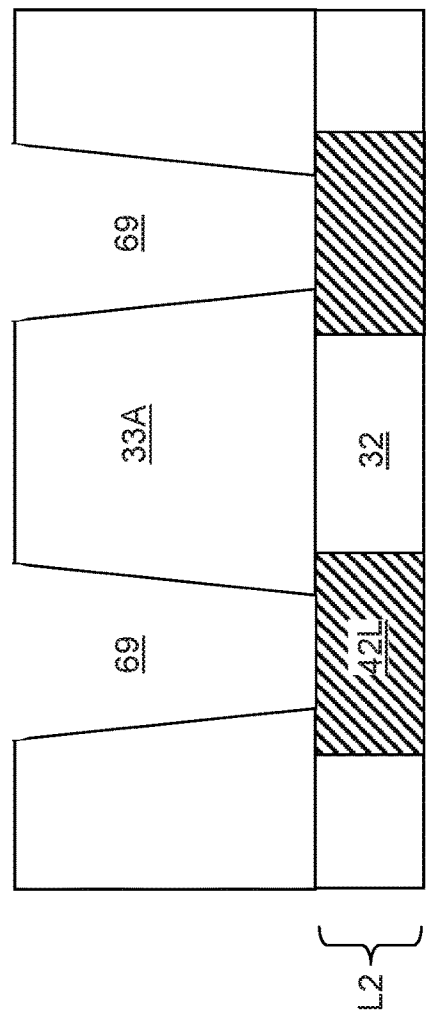

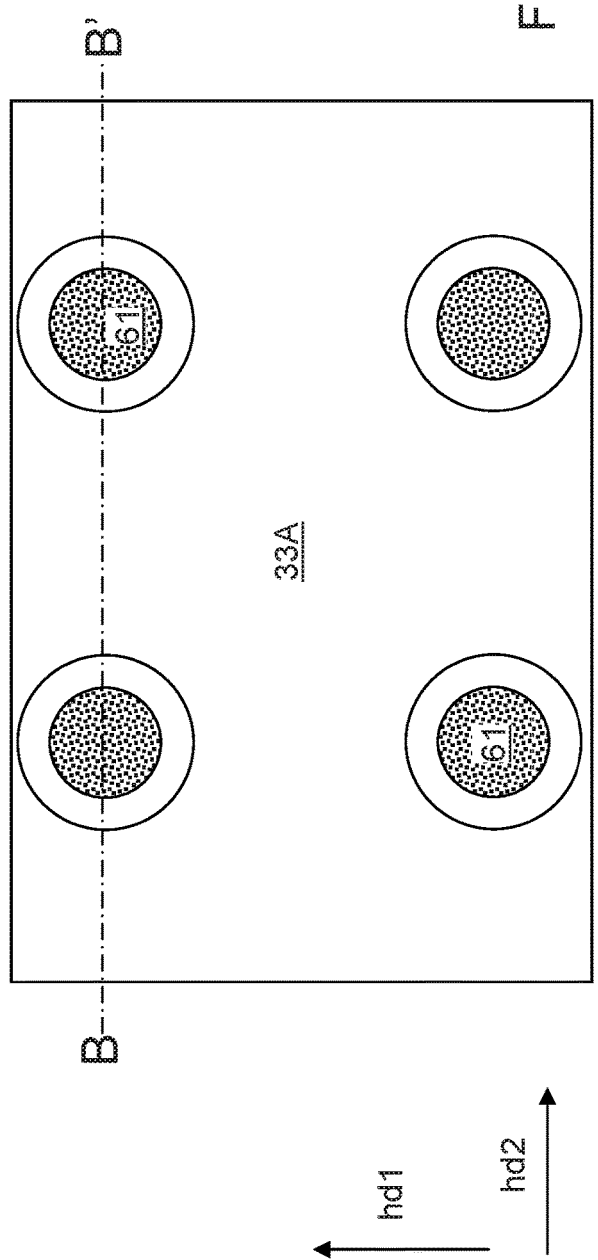
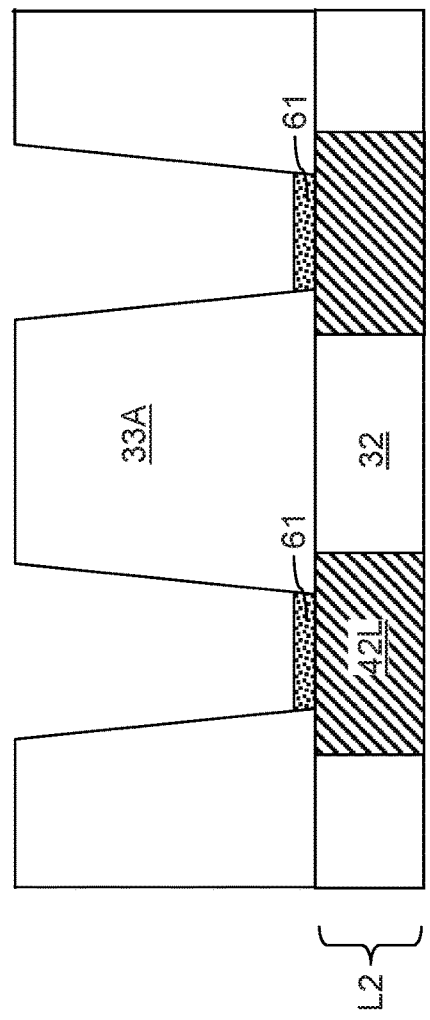

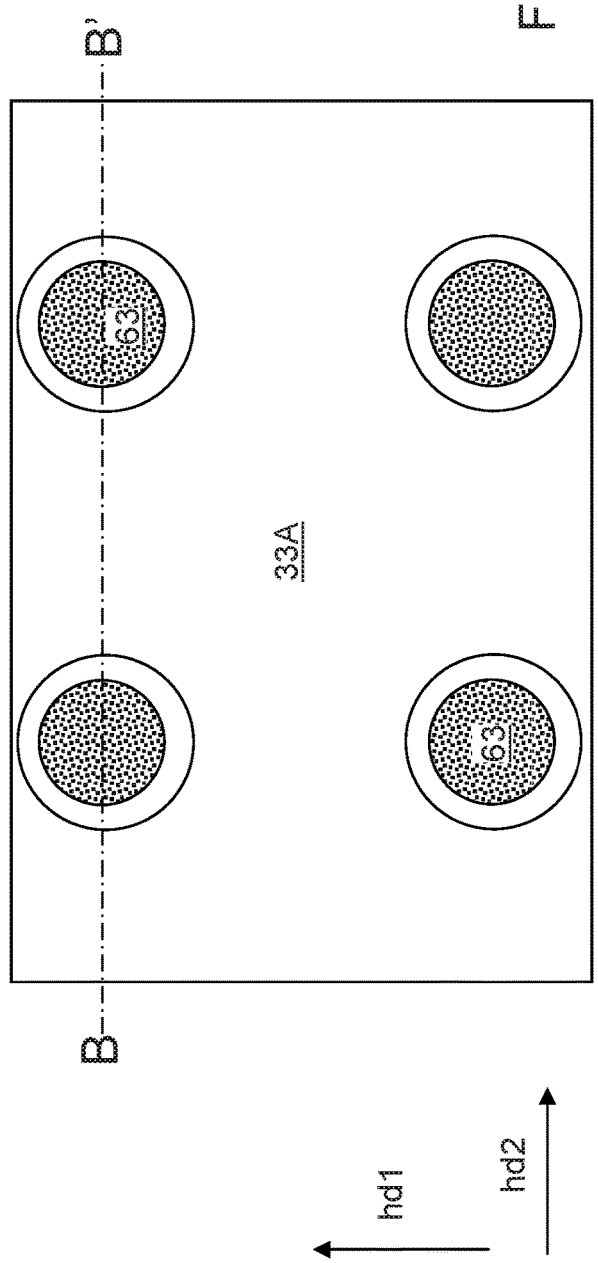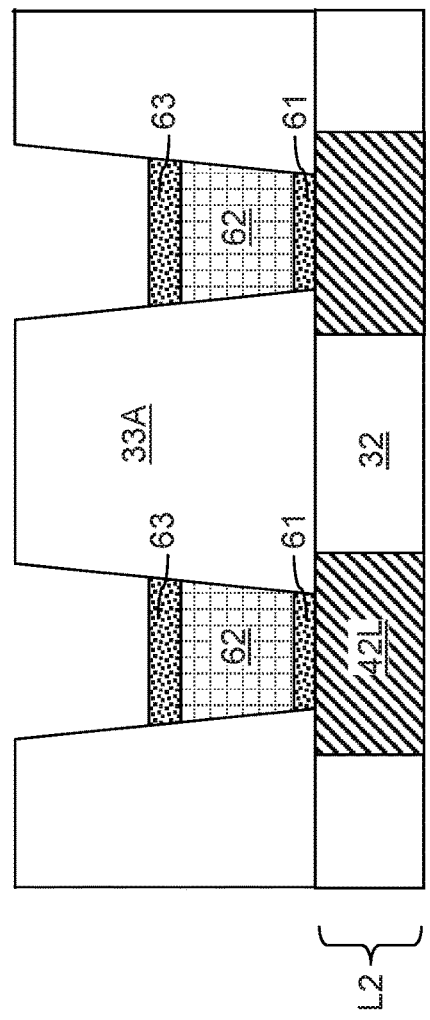
FIG. 7A
FIG. 7B

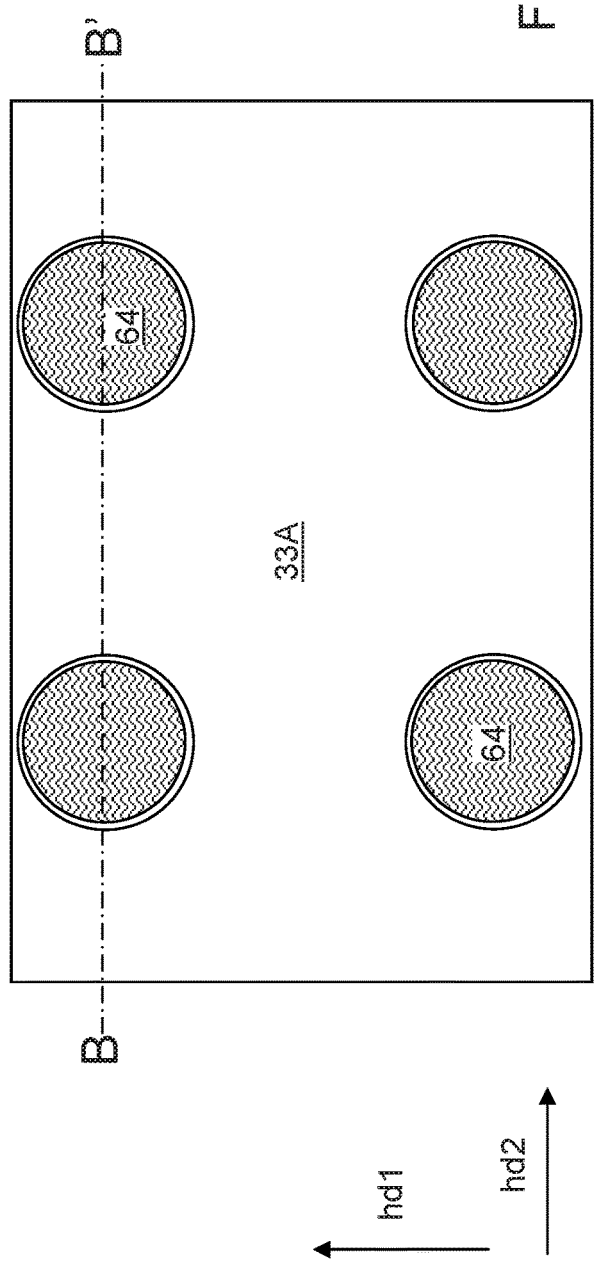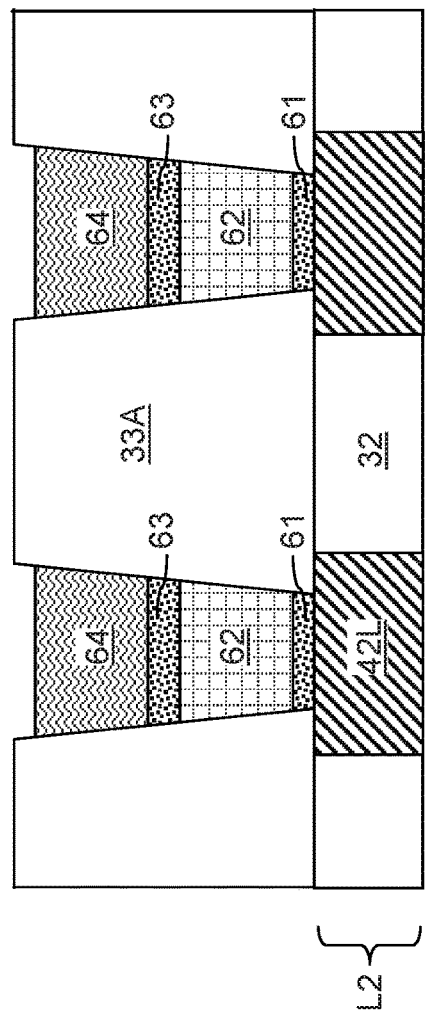
FIG. 8A
FIG. 8B

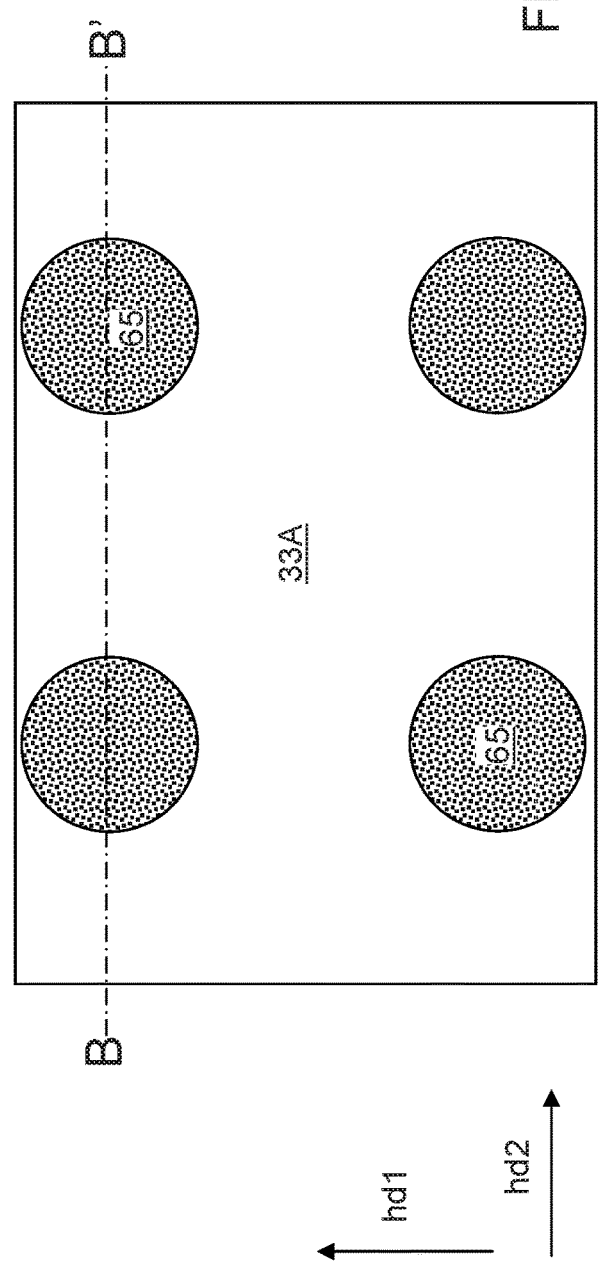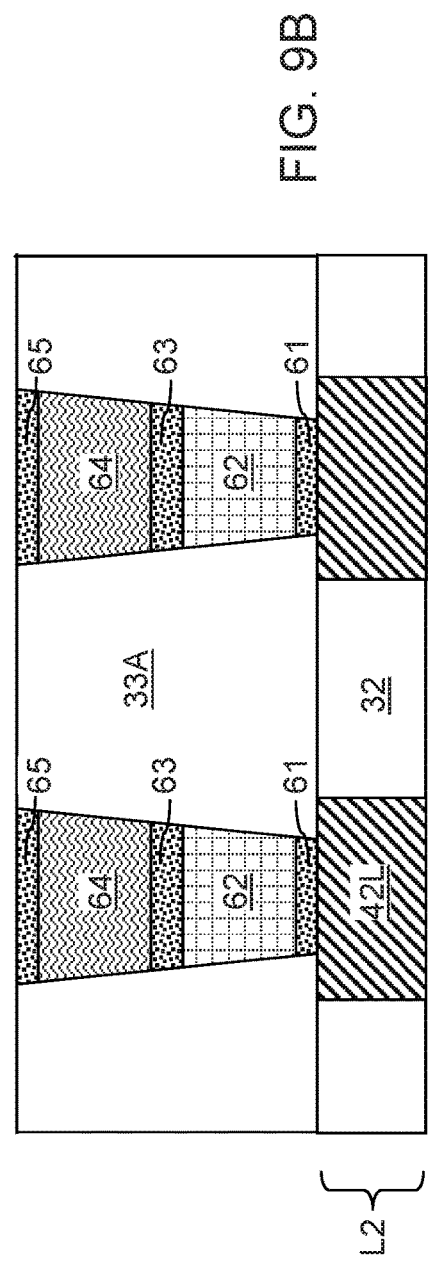

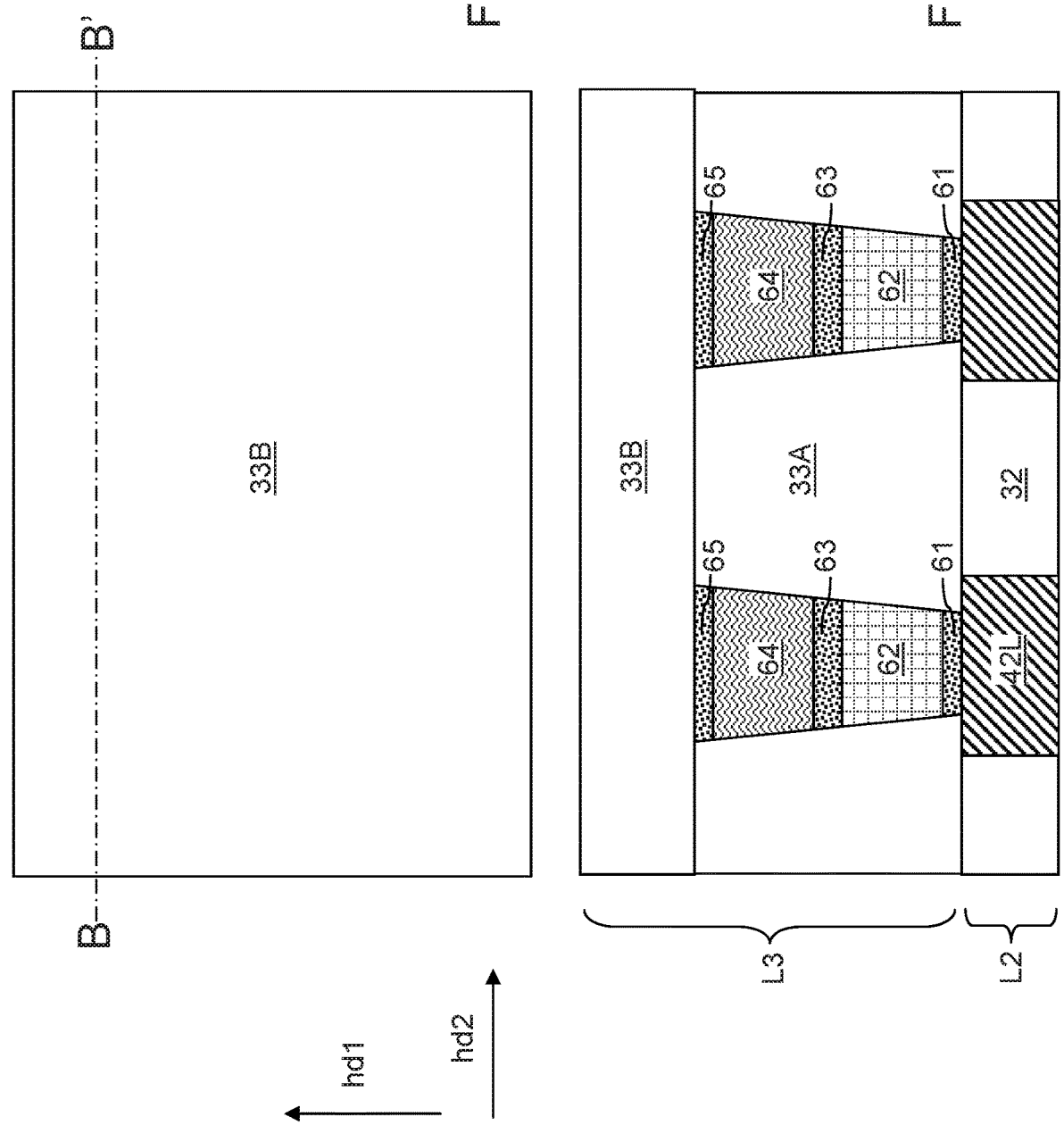

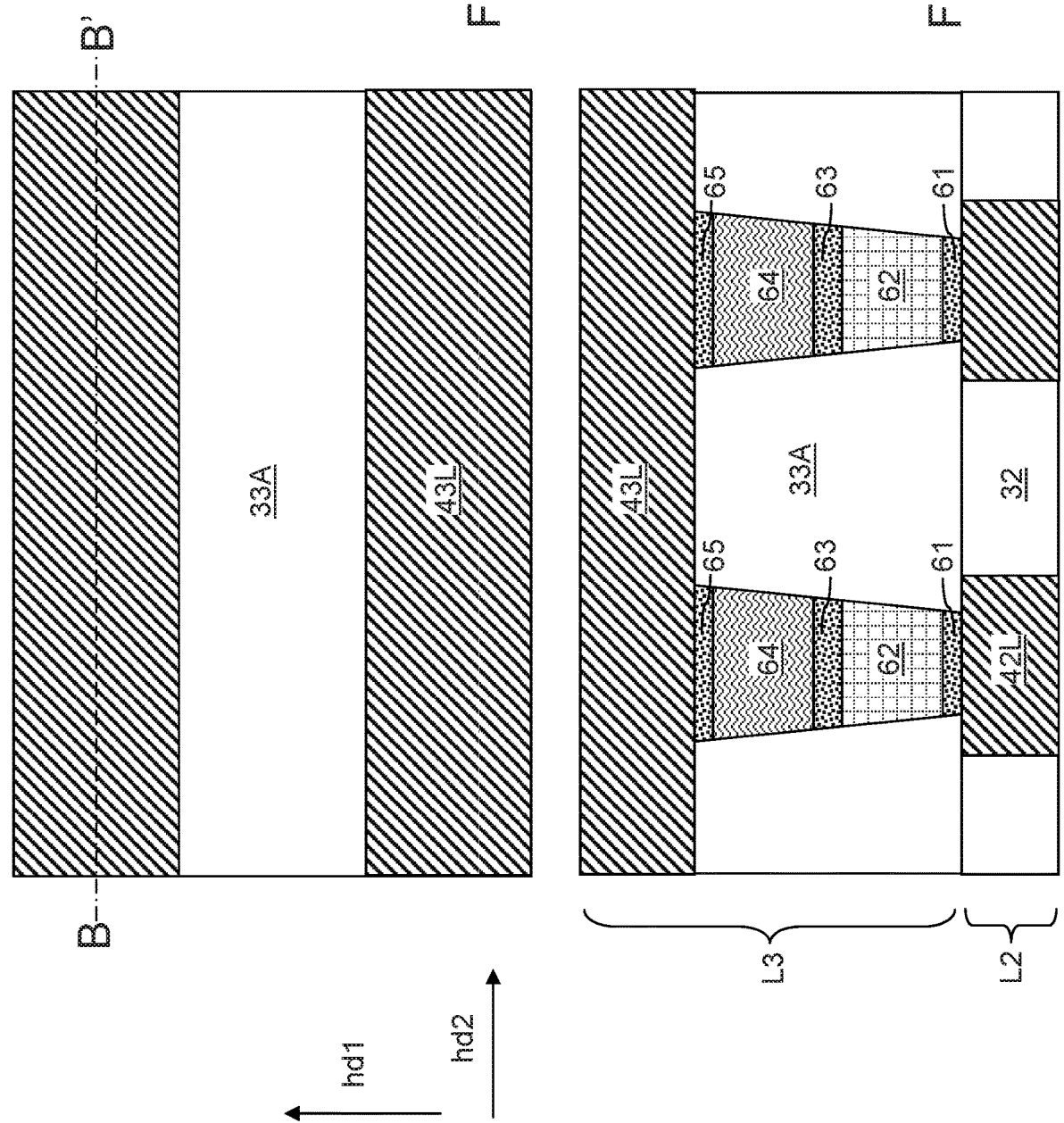

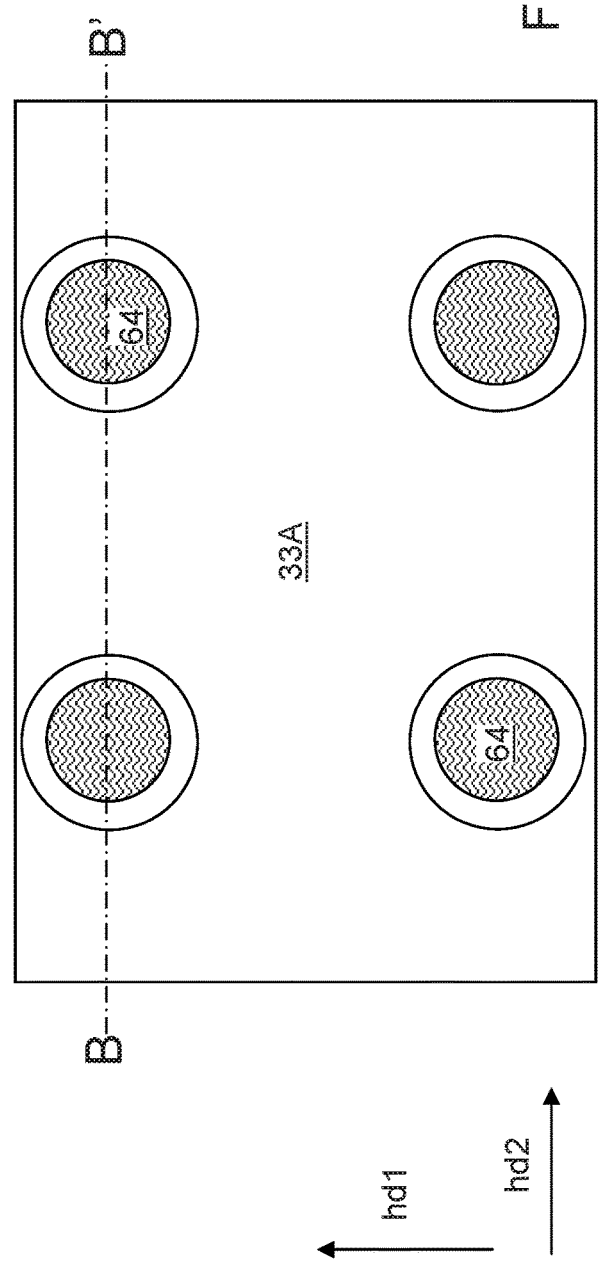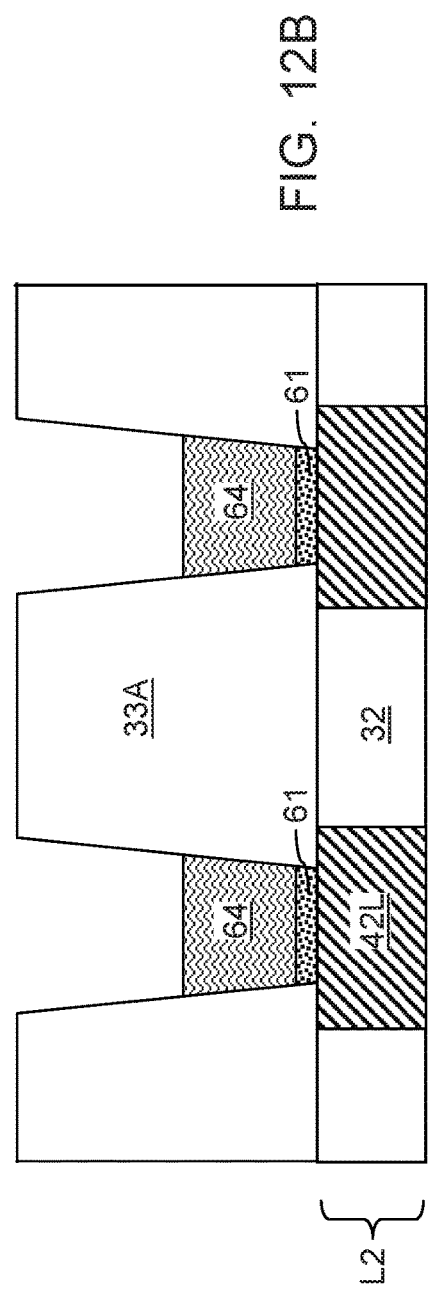

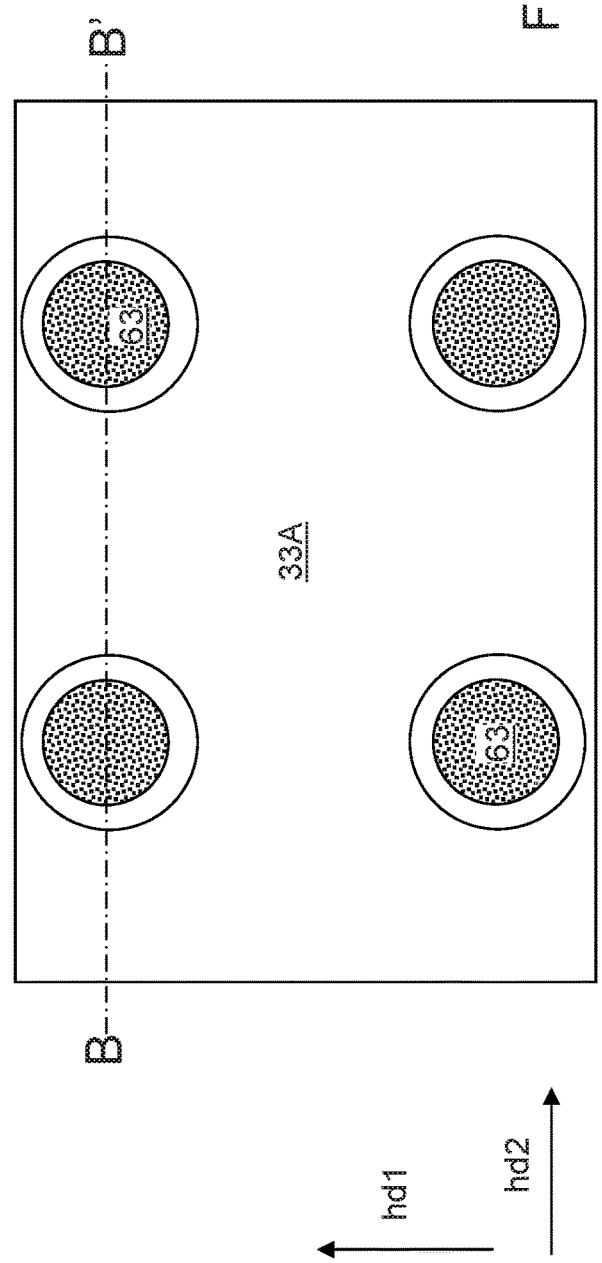
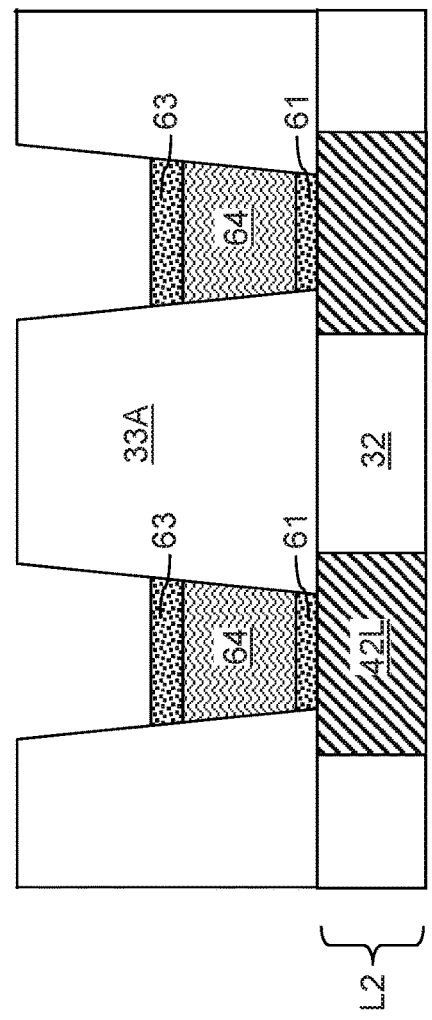
FIG. 13A
FIG. 13B

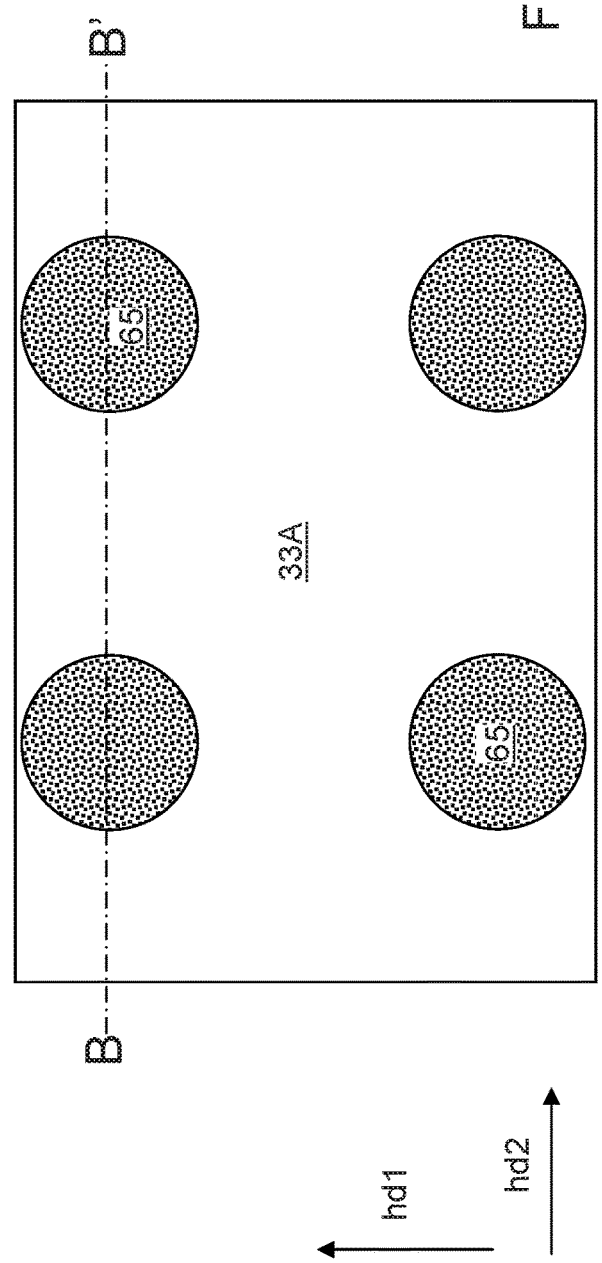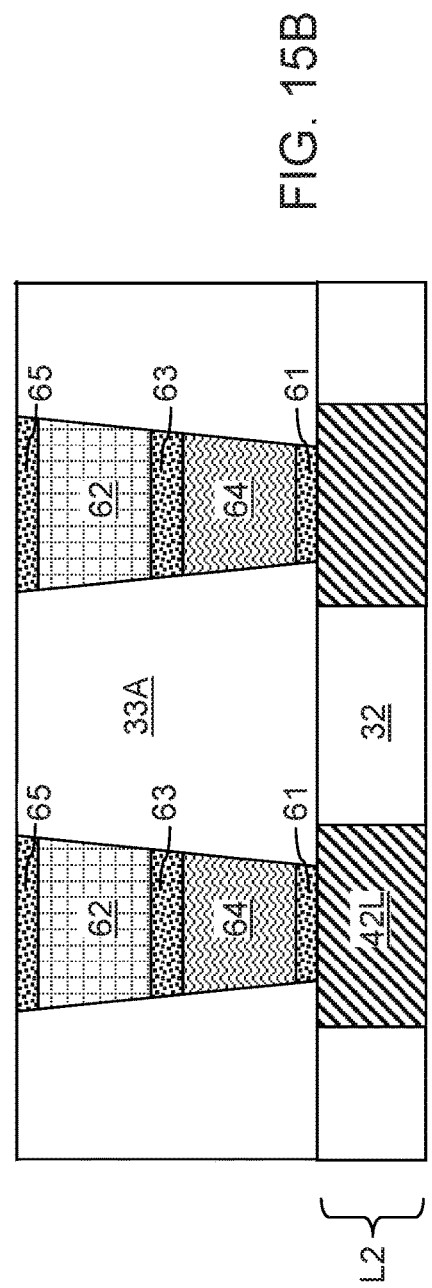

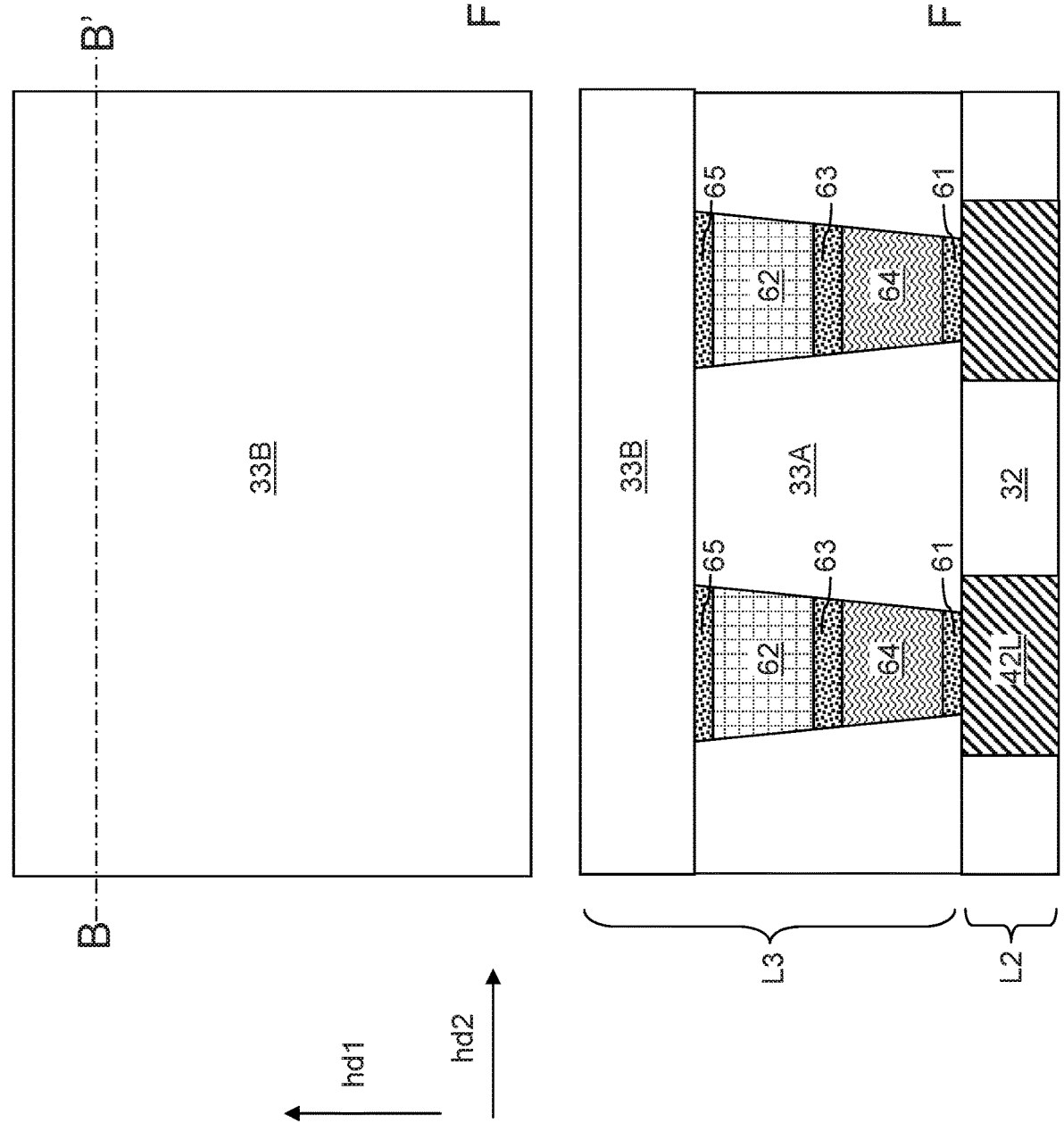

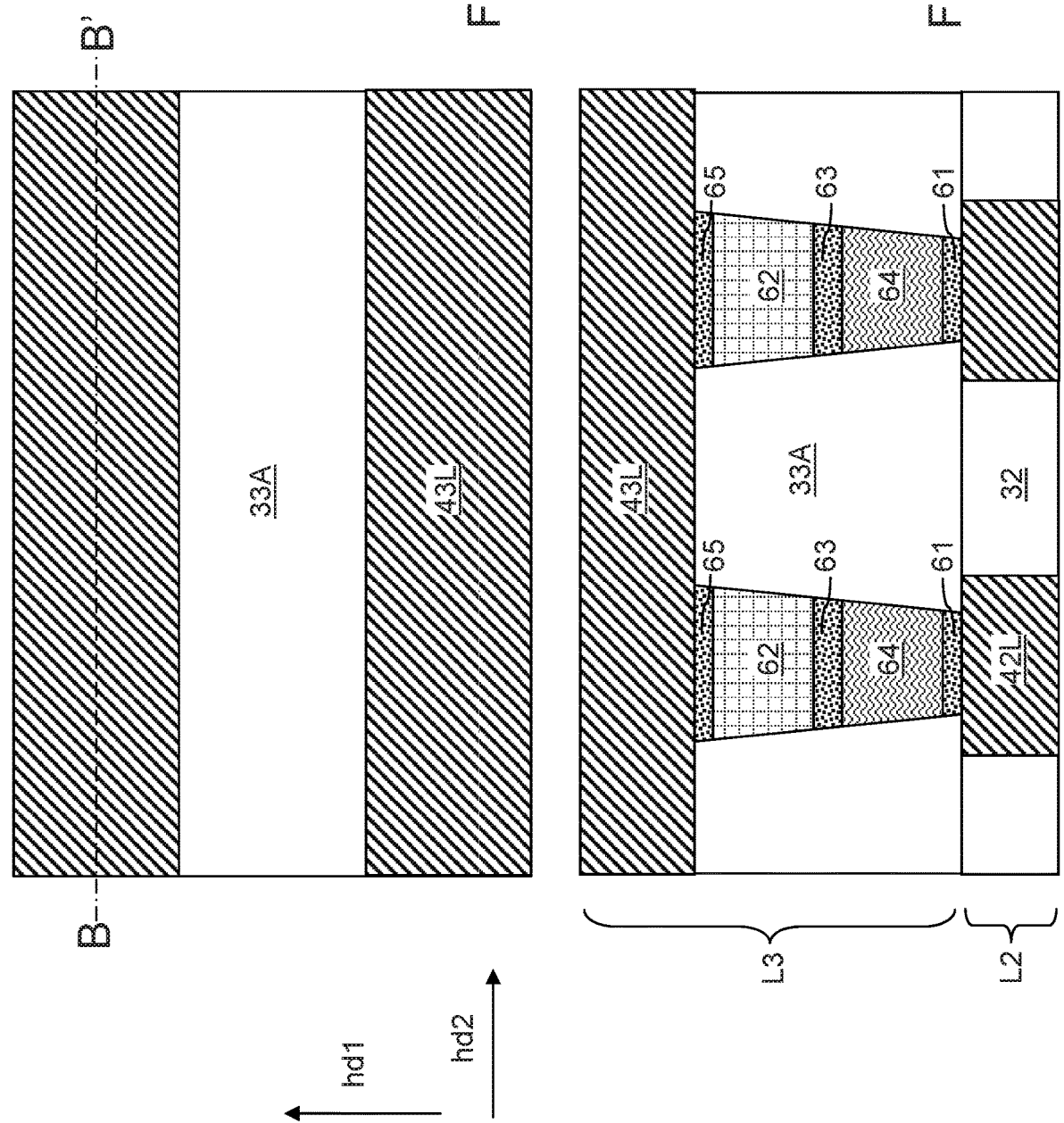

CROSS-POINT MEMORY-SELECTOR COMPOSITE PILLAR STACK STRUCTURES AND METHODS OF FORMING THE SAME

BACKGROUND

The present disclosure is directed to semiconductor devices, and specifically to memory devices including cross-point memory-selector composite pillar stack structures formed within a respective pillar cavity and methods of forming the same.

A cross-point array of elements is an array of elements that are accessed by two sets of access lines that extend along different directions. Each element may be a two-terminal device. A first terminal of each element may be connected to an access line within a first set of access lines, and a second terminal of each element may be connected to an access line within a second set of access lines. A cross-point array of elements provides efficient random access to each element within the cross-point array through selection of an access line from the first set of access lines and another access line selected from the second set of access lines. Each access line may be controlled by a respective access control transistor. Thus, an M×N cross-point array of elements may include M of first access lines and N of second access lines. In other words, a total of (M+N) transistors may control access to M×N elements within the array. Selection of a target element may be effected by activating a first access line selected from the M first access lines and by activating a second access line selected from the N second access lines.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2A is a top-down view of a portion of a memory array region after formation of first conductive lines (such as second metal lines) embedded in a first dielectric material layer (such as a second interconnect-level dielectric layer) according to a first embodiment of the present disclosure.

FIG. 2B is a vertical cross-sectional view of the portion of the memory array region along the vertical plane B-B' of FIG. 2A.

FIG. 3A is a top-down view of the portion of the memory array region after formation of a via-level dielectric material layer according to the first embodiment of the present disclosure.

FIG. 3B is a vertical cross-sectional view of the portion of the memory array region along the vertical plane B-B' of FIG. 3A.

FIG. 4A is a top-down view of the portion of the memory array region after formation of a two-dimensional array of via cavities according to the first embodiment of the present disclosure.

FIG. 4B is a vertical cross-sectional view of the portion of the memory array region along the vertical plane B-B' of FIG. 4A.

FIG. 5A is a top-down view of the portion of the memory array region after formation of a two-dimensional array of bottom barrier material plates according to the first embodiment of the present disclosure.

FIG. 5B is a vertical cross-sectional view of the portion of the memory array region along the vertical plane B-B' of FIG. 5A.

FIG. 7A is a top-down view of the portion of the memory array region after formation of a two-dimensional array of intermediate barrier material plates according to the first embodiment of the present disclosure.

FIG. 7B is a vertical cross-sectional view of the portion of the memory array region along the vertical plane B-B' of FIG. 7A.

FIG. 8A is a top-down view of the portion of the memory array region after formation of a two-dimensional array of memory material pillars according to the first embodiment of the present disclosure.

FIG. 8B is a vertical cross-sectional view of the portion of the memory array region along the vertical plane B-B' of FIG. 8A.

FIG. 9A is a top-down view of the portion of the memory array region after formation of a two-dimensional array of top barrier material plates according to the first embodiment of the present disclosure.

FIG. 9B is a vertical cross-sectional view of the portion of the memory array region along the vertical plane B-B' of FIG. 9A.

FIG. 10A is a top-down view of the portion of the memory array region after formation of a second dielectric material layer according to the first embodiment of the present disclosure.

FIG. 10B is a vertical cross-sectional view of the portion of the memory array region along the vertical plane B-B' of FIG. 10A.

FIG. 11A is a top-down view of the portion of the memory array region after formation of second conductive lines according to the first embodiment of the present disclosure.

FIG. 11B is a vertical cross-sectional view of the portion of the memory array region along the vertical plane B-B' of FIG. 11A.

FIG. 12A is a top-down view of the portion of the memory array region after formation of a two-dimensional array of memory material pillars according to the second embodiment of the present disclosure.

FIG. 12B is a vertical cross-sectional view of the portion of the memory array region along the vertical plane B-B' of FIG. 12A.

FIG. 13A is a top-down view of the portion of the memory array region after formation of a two-dimensional array of intermediate barrier material plates according to the second embodiment of the present disclosure.

FIG. 13B is a vertical cross-sectional view of the portion of the memory array region along the vertical plane B-B' of FIG. 13A.

FIG. 15A is a top-down view of the portion of the memory array region after formation of a two-dimensional array of top barrier material plates according to the second embodiment of the present disclosure.

FIG. 15B is a vertical cross-sectional view of the portion of the memory array region along the vertical plane B-B' of FIG. 15A.

FIG. 16A is a top-down view of the portion of the memory array region after formation of a second dielectric material layer according to the second embodiment of the present disclosure.

FIG. 16B is a vertical cross-sectional view of the portion of the memory array region along the vertical plane B-B' of FIG. 16A.

FIG. 17A is a top-down view of the portion of the memory array region after formation of second conductive lines according to the second embodiment of the present disclosure.

FIG. 17B is a vertical cross-sectional view of the portion of the memory array region along the vertical plane B-B' of FIG. 17A.

DETAILED DESCRIPTION

Figure 1A:
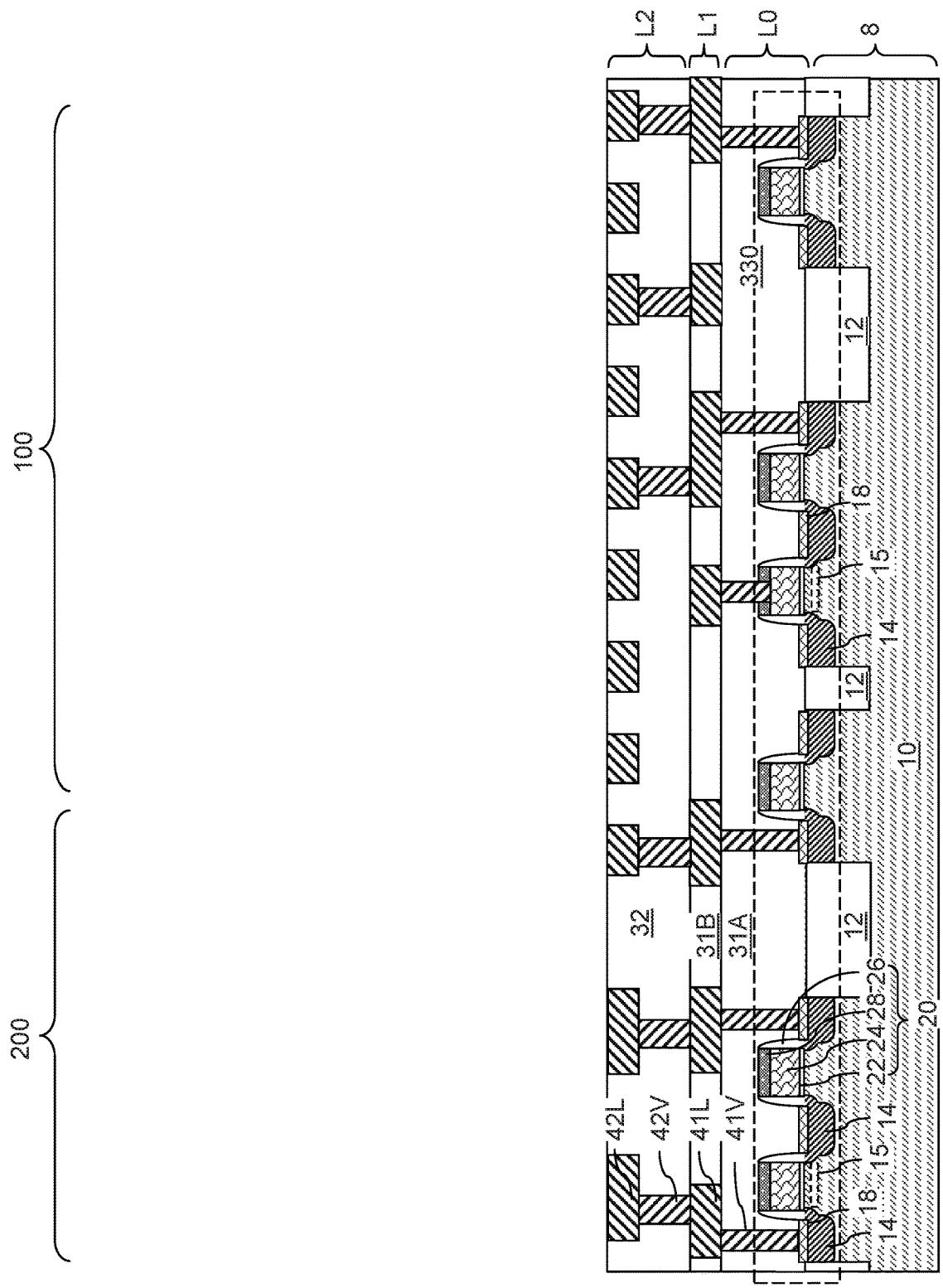
FIG. 1A is a vertical cross-sectional view of an exemplary structure during prior to formation of an array of resistive memory elements according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various conventional methods for forming a cross-point array have been proposed. Generally, conventional methods require deposition of a stack of multiple planar material layers over a set of first access lines, followed by patterning the stack of multiple planar material layers into an array of pillar-shaped elements using an anisotropic etch process including multiple etch steps having a respective etch chemistry that etches a respective material layer within the stack of multiple planar material layers. Because the stack of multiple planar material layers includes multiple materials having different material compositions, the anisotropic etch process generally induces collateral etching of patterned portions of upper material layers during etching of the lower material layers within the stack of multiple planar material layers. The resulting pillar structures have shapes of stepped pyramids with lateral steps and tapered surfaces that induce narrowing of the pillar structures with an increasing vertical distance from underlying metal lines. Uncontrolled variations in the lateral dimensions of stepped pyramid-shaped structures induce variations in the electrical properties of memory elements. Due to these uncontrolled variations, memory cell scaling is limited. Thus, conventional methods of forming a cross-point array face low yield and high manufacturing cost.

Generally, the embodiment structures and methods of the present disclosure may be used to form at least one layer of a two-dimensional array of resistive memory elements in a metal interconnect level. The resistive memory elements may be formed in a cross-point array configuration at each intersection point between rows of word lines and columns of bit lines. Each bit line may be provided within a respective rail structure. In some embodiments, each rail structure may include a vertical stack including a lower bit line and an upper bit line, and a first layer of a lower two-dimensional array of resistive memory elements and a second layer of an upper two-dimensional array of resistive memory elements that share a same set of word lines may be provided. The rail structures including the bit lines may be arranged as columns that laterally extend along a first horizontal direction. Dielectric isolation structures that laterally extend along a second horizontal direction may be formed over the columns of rail structures. A layer stack including a resistive memory material layer and a selector material layer may be formed in each line trench located between each neighboring pair of dielectric isolation structures. Word lines may be formed in unfilled portions of the line trenches on a respective layer stack of a resistive memory material layer and a selective material layer. Each portion of a resistive memory material layer located between a neighboring pair of a bit line and a word line constitutes a memory element. Multiple two-dimensional arrays of resistive memory elements may be stacked over multiple metal interconnect levels to provide a three-dimensional array of resistive memory elements. Various features of the embodiment structures and methods are described in detail herebelow.

Referring to FIG. 1A, an exemplary structure according to an embodiment of the present disclosure is illustrated prior to formation of an array of resistive memory elements. The exemplary structure includes a substrate 8 that contains a semiconductor material layer 10. The substrate 8 may include a bulk semiconductor substrate such as a silicon substrate in which the semiconductor material layer continuously extends from a top surface of the substrate 8 to a bottom surface of the substrate 8, or a semiconductor-oninsulator layer including the semiconductor material layer 10 as a top semiconductor layer overlying a buried insulator layer (such as a silicon oxide layer). The exemplary structure may include various devices regions, which may include a memory array region 100 in which at least one array of resistive memory elements may be subsequently formed and a peripheral region 200 in which electrical connections between each array of resistive memory elements and a peripheral circuit including field effect transistors may be subsequently formed. Areas of the memory array region 100 and the peripheral region 200 may be used to form various elements of the peripheral circuit.

Semiconductor devices such as field effect transistors may be formed on, and/or in, the semiconductor material layer 10. For example, shallow trench isolation structures 12 may be formed in an upper portion of the semiconductor material layer 10 by forming shallow trenches and subsequently filling the shallow trenches with a dielectric material such as silicon oxide. Various doped wells (not expressly shown) may be formed in various regions of the upper portion of the semiconductor material layer 10 by performing masked ion implantation processes.

Gate structures 20 may be formed over the top surface of the substrate 8 by depositing and patterning a gate dielectric layer, a gate electrode layer, and a gate cap dielectric layer. Each gate structure 20 may include a vertical stack of a gate dielectric 22, a gate electrode 24, and a dielectric gate cap 28, which is herein referred to as a gate stack (22, 24, 28). Ion implantation processes may be performed to form extension implant regions, which may include source extension regions and drain extension regions. Dielectric gate spacers 26 may be formed around the gate stacks (22, 24, 28). Each assembly of a gate stack (22, 24, 28) and a dielectric gate spacer 26 constitutes a gate structure 20. Additional ion implantation processes may be performed using the gate structures 20 as self-aligned implantation masks to form deep active regions, which may include deep source regions and deep drain regions. Upper portions of the deep active regions may overlap with portions of the extension implantation regions. Each combination of an extension implantation region and a deep active region constitutes an active region 14, which may be a source region or a drain region depending on electrical biasing. A semiconductor channel 15 may be formed underneath each gate stack (22, 24, 28) between a neighboring pair of active regions 14. Metal-semiconductor alloy regions 18 may be formed on the top surface of each active region 14. Field effect transistors may be formed on the semiconductor material layer 10. Each field effect transistor may include a gate structure 20, a semiconductor channel 15, a pair of active regions 14 (one of which functions as a source region and another of which functions as a drain region), and optional metal-semiconductor alloy regions. A complementary metal-oxide-semiconductor (CMOS) circuit 330 may be provided on the semiconductor material layer 10, which may include a periphery circuit for the array(s) of resistive memory elements to be subsequently formed.

Various interconnect-level structures may be subsequently formed, which are formed prior to formation of an array of resistive memory elements and are herein referred to as lower interconnect-level structures (L0, L1, L2). In embodiments in which a two-dimensional array of resistive memory elements is to be subsequently formed over two levels of interconnect-level metal lines, the lower interconnect-level structures (L0, L1, L2) may include a contact-level structure L0, a first interconnect-level structure L1, and a second interconnect-level structure L2. The contact-level structure L0 may include a planarization dielectric layer 31A including a planarizable dielectric material such as silicon oxide and various contact via structures 41V contacting a respective one of the active regions 14 or the gate electrodes 24 and formed within the planarization dielectric layer 31A. The first interconnect-level structure L1 includes a first interconnect-level dielectric layer 31B and first metal lines 41L formed within the first interconnect-level dielectric layer 31B. The first interconnect-level dielectric layer 31B is also referred to as a first line-level dielectric layer. The first metal lines 41L may contact a respective one of the contact via structures 41V. The second interconnect-level structure L2 includes a second interconnect-level dielectric layer 32, which may include a stack of a first via-level dielectric material layer and a second line-level dielectric material layer or a line-and-via-level dielectric material layer. The second interconnect-level dielectric layer 32 covers second interconnect-level metal interconnect structures (42V, 42L), which includes first metal via structures 42V and second metal lines 42L. Top surfaces of the second metal lines 42L may be coplanar with the top surface of the second interconnect-level dielectric layer 32.

Figure 1B:
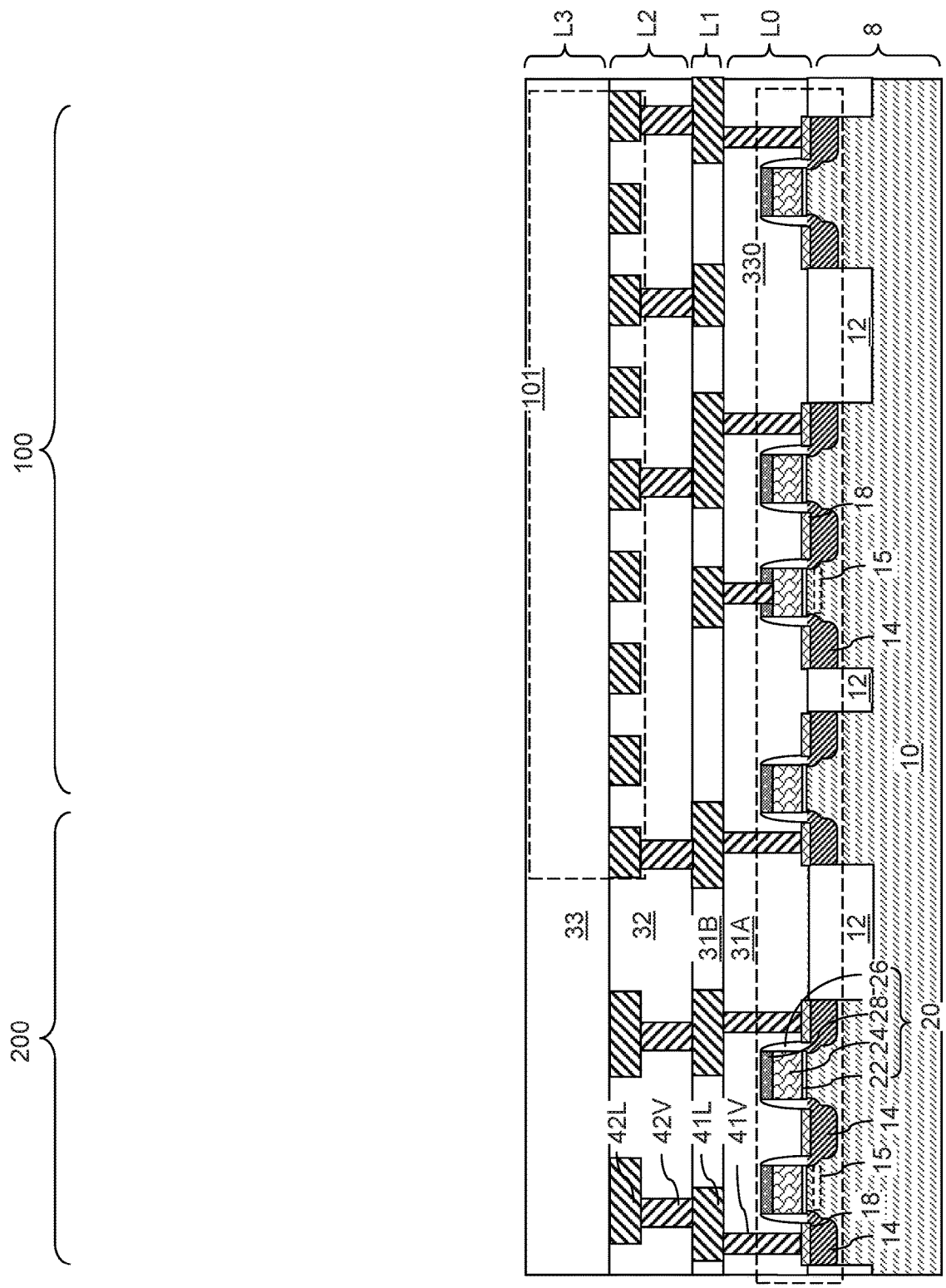
FIG. 1B is a vertical cross-sectional view of the exemplary structure during after formation of the array of resistive memory elements according to an embodiment of the present disclosure.

Referring to FIG. 1B, a third interconnect-level dielectric layer 33 may be formed over the second interconnect-level structure L2. The combination of the third interconnect-level dielectric layer 33 and all structures to be formed therein are referred to as a third interconnect-level structure L3. An array 101 of resistive memory elements may be formed in the memory array region 100 in an upper portion of the second interconnect-level structure L2 and in the third interconnect-level structure L3. The array 101 of resistive memory elements may use a subset of the second metal lines 42L as first access lines, which are electrically conductive lines that may be used as word lines or bit lines. Further, the array 101 of resistive memory elements may use a subset of third metal lines 43L as second access lines, which are electrically conductive lines that may be used as bit lines or word lines. If the first access lines are used as word lines, the second access lines are used as bit lines, and vice versa. Thus, the array 101 of resistive memory elements may be formed as a two-dimensional cross-point array of memory elements that may be randomly accessible through selection of one of the first access lines and one of the second access lines. The third interconnect-level dielectric layer 33 may be formed during formation of the array 101 of resistive memory elements. The details for the structure and the processing steps for the array 101 of resistive memory elements are subsequently described in detail.

Figure 1C:
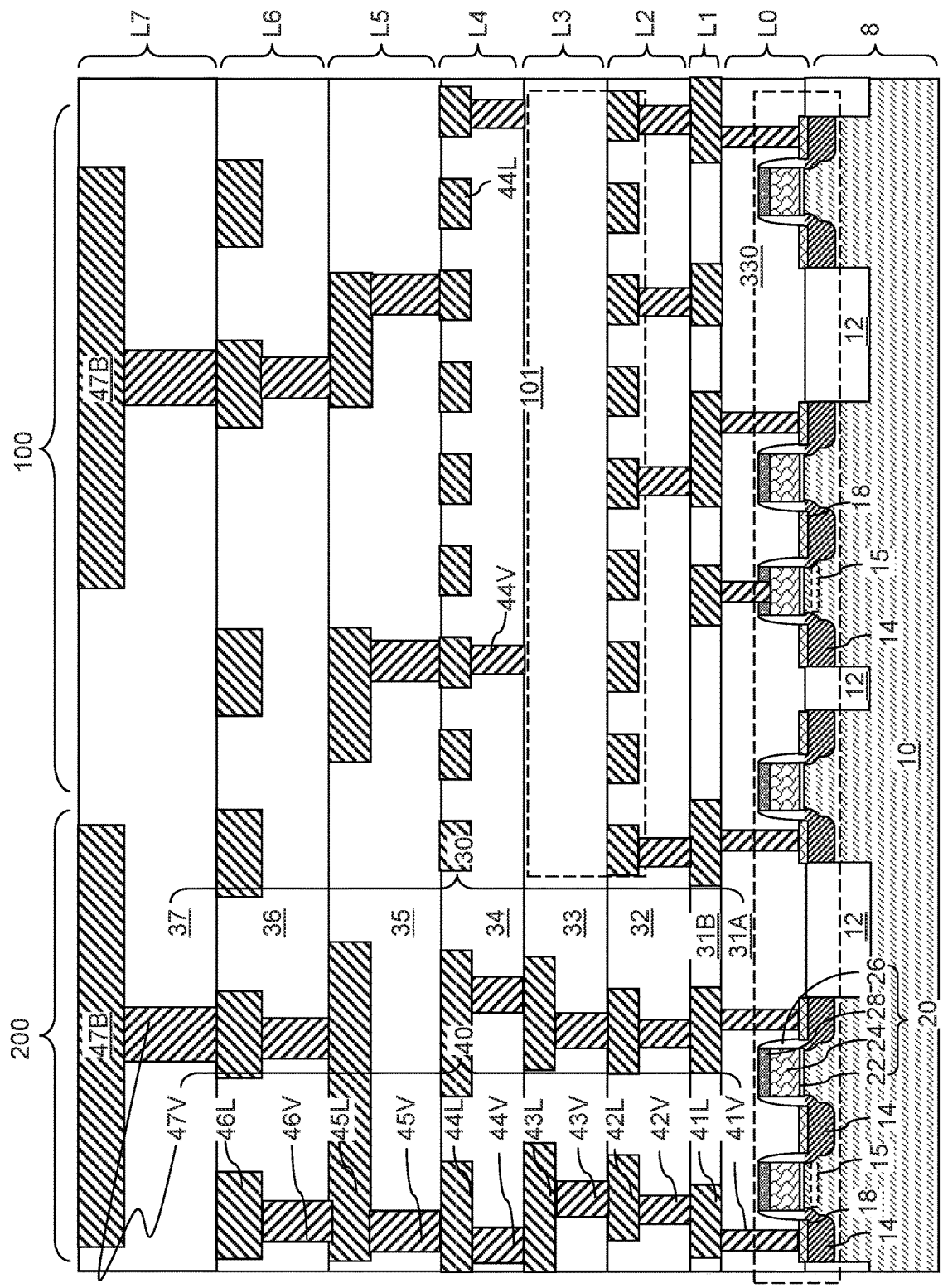
FIG. 1C is a vertical cross-sectional view of the exemplary structure during after formation of upper-level metal interconnect structures according to an embodiment of the present disclosure.

Referring to FIG. 1C, third interconnect-level metal interconnect structures (43V, 43L) may be formed in the third interconnect-level dielectric layer 33. The third interconnect-level metal interconnect structures (43V, 43L) may include second metal via structures 43V and third metal lines 43L. Additional interconnect-level structures may be subsequently formed, which are herein referred to as upper interconnect-level structures (L4, L5, L6, L7). For example, the upper interconnect-level structures (L4, L5, L6, L7) may include a fourth interconnect-level structure L4, a fifth interconnect-level structure L5, a sixth interconnect-level structure L6, and a seventh interconnect-level structure L7. The fourth interconnect-level structure L4 may include a fourth interconnect-level dielectric layer 34 covering fourth interconnect-level metal interconnect structures (44V, 44L), which may include third metal via structures 44V and fourth metal lines 44L. The fifth interconnect-level structure L5 may include a fifth interconnect-level dielectric layer 35 forming fifth interconnect-level metal interconnect structures (45V, 45L), which may include fourth metal via structures 45V and fifth metal lines 45L. The sixth interconnect-level structure L6 may include a sixth interconnect-level dielectric layer 36 forming sixth interconnect-level metal interconnect structures (46V, 46L), which may include fifth metal via structures 46V and sixth metal lines 46L. The seventh interconnect-level structure L7 may include a seventh interconnect-level dielectric layer 37 forming sixth metal via structures 47V (which are seventh interconnect-level metal interconnect structures) and metal bonding pads 47B. The metal bonding pads 47B may be configured for solder bonding (which may use C4 ball bonding or wire bonding), or may be configured for metal-to-metal bonding (such as copper-to-copper bonding).

Each interconnect-level dielectric layer may be referred to as an interconnect-level dielectric (ILD) layer 30. Each interconnect-level metal interconnect structures may be referred to as a metal interconnect structure 40. Each combination of a metal via structure and an overlying metal line located within a same interconnect-level structure (L2-L7) may be formed sequentially as two distinct structures by using two single damascene processes, or may be simultaneously formed as a unitary structure using a dual damascene process. Each of the metal interconnect structure 40 may include a respective metallic liner layer (such as a layer of TiN, TaN, or WN having a thickness in a range from 2 nm to 20 nm) and a respective metallic fill material (such as W, Cu, Co, Mo, Ru, other elemental metals, or an alloy or a combination thereof). Various etch stop dielectric layers and dielectric capping layers may be inserted between vertically neighboring pairs of ILD layers 30, or may be incorporated into one or more of the ILD layers 30.

While the present disclosure is described using an embodiment in which the array 101 of resistive memory elements is formed as a component of a third interconnect-level structure L3, embodiments are expressly contemplated herein in which the array 101 of resistive memory elements is formed as components of any other interconnect-level structure (e.g., L1, L2, L4, L5, L6, L7, etc.). Further, while the present disclosure is described using an embodiment in which a set of eight interconnect-level structures are formed, embodiments are expressly contemplated herein in which a different number of interconnect-level structures is used. In addition, embodiments are expressly contemplated herein in which two or more arrays 101 of resistive memory elements are provided within multiple interconnect-level structures in the memory array region 100. While the present disclosure is described using an embodiment in which an array 101 of resistive memory elements is formed in a single interconnect-level structure, embodiments are expressly contemplated herein in which an array 101 of resistive memory elements is formed over two vertically adjoining interconnect-level structures.

Referring to FIGS. 2A and 2B, a portion of the memory array region 100 according to an embodiment of the present disclosure is illustrated after the processing steps of FIG. 1A. Generally, a subset of the second metal lines 42L may include at least one first conductive structure formed in an upper portion of the second interconnect-level dielectric layer 32, which is herein referred to as a first dielectric material layer. In one embodiment, the at least one first conductive structure may comprise first conductive lines that are parallel to one another and formed in the first dielectric material layer (such as the second interconnect-level dielectric layer 32) that is formed over a top surface of the substrate 8. The first conductive lines may be a subset of the second metal lines 42L, and may be formed concurrently with other second metal lines 42L that are formed in the peripheral region 200.

In one embodiment, the first conductive lines (which may comprise a subset of the second metal lines 42L) may laterally extend along a first horizontal direction with a uniform width. In one embodiment, the first conductive lines may be laterally spaced from one another with a uniform spacing. In such an embodiment, the first conductive lines may be arranged as a periodic one-dimensional array that is repeated along the second horizontal direction with a periodicity. The width of each first conductive line may be in a range from 20 nm to 100 nm, and the spacing between each neighboring pair of first conductive lines may be in a range from 20 nm to 100 nm, although lesser and greater widths and spacings may also be used. The height of each first conductive line may be in a range from 25 nm to 200 nm, although lesser and greater heights may also be used. The first conductive lines include a metallic material such as tungsten, copper, titanium nitride, titanium, etc. Other suitable materials are within the contemplated scope of disclosure.

Referring to FIGS. 3A and 3B, a via-level dielectric material layer 33A may be formed over the first conductive lines. In such embodiments, the first conductive lines comprise a subset of the second metal lines 42L, the via-level dielectric material layer 33A may be formed as a lower component layer (i.e., a sub-layer) of the third interconnect-level dielectric layer 33. The via-level dielectric material layer 33A includes a dielectric material, which is herein referred to as a via-level dielectric material. The via-level dielectric material may include undoped silicate glass, a doped silicate glass (such as borosilicate glass, phosphosilicate glass, or fluorosilicate glass), or organosilicate glass. The via-level dielectric material layer 33A may be formed by chemical vapor deposition (CVD) or by spin-coating. The thickness of the via-level dielectric material layer 33A may be in a range from 50 nm to 200 nm, although lesser and greater thicknesses may also be used. The thickness of the via-level dielectric material layer 33A may be optimized based on the total height of a set of material portions to be serially connected to provide a selector-memory element to be subsequently formed. Each selector-memory element may have a function of a selector that turns on a circuit only when a bias voltage greater than a critical bias voltage is applied, and a function of a memory element that stores a data bit in the form of a resistive state selected from multiple possible resistive states, e.g., a low resistance state or a high resistance state.

Referring to FIGS. 4A and 4B, at least one via cavity 69 may be formed through the via-level dielectric material layer 33A over the at least one first conductive structure such that a top surface a respective first conductive structure is physically exposed at the bottom of each via cavity 69. For example, a photoresist layer (not shown) may be applied over the top surface of the via-level dielectric material layer 33A, and may be lithographically patterned to form a two-dimensional array of openings therethrough. Each opening in the rectangular periodic array of openings may have a circular horizontal cross-sectional shape or an oval horizontal cross-sectional shape.

The two-dimensional array of openings may be a rectangular periodic array of openings having a first pitch (i.e., periodicity) along the first horizontal direction hd1 and a second pitch along the second horizontal direction hd2. The second pitch of the rectangular periodic array of openings along the second horizontal direction hd2 may be the same as the pitch of the first conductive lines located in the memory array region 100 and may comprise a subset of the second metal lines 42L. The first pitch of the rectangular periodic array of openings along the first horizontal direction hd2 may be the same as the pitch of second conductive lines to be subsequently formed above the via-level dielectric material layer 33A. Each opening in the rectangular periodic array of openings may have an areal overlap with a respective underlying one of the first conductive lines. In one embodiment, each row of openings in the rectangular periodic array of openings that are arranged along the first horizontal direction may be located entirely within the area of a respective one of the first conductive line in a plan view such as a top-down view.

An anisotropic etch process such as a reactive ion etch process may be performed to transfer the pattern in the photoresist layer through the via-level dielectric material layer 33A. A two-dimensional array of via cavities 69 may be formed through the via-level dielectric material layer 33A. If the openings through the photoresist layer comprise a rectangular two-dimensional periodic array, a rectangular two-dimensional periodic array of via cavities 69 may be formed through the via-level dielectric material layer 33A. Due to the inherent masking characteristics of the photoresist layer during the anisotropic etch process, the maximum lateral dimension of each via cavity 69 may decrease with an increase in the etch distance from the horizontal plane including the top surface of the via-level dielectric material layer 33A. In other words, each via cavity 69 may be formed with a finite taper angle such that the bottom portion of each via cavity 69 is narrower than the top portion of each via cavity 69. Generally, less reactive ions impinge onto peripheral portions of each via cavity 69 than onto the center portion of each via cavity due to the geometrical shielding effects of the patterned photoresist layer. Thus, the lateral dimension of each via cavity 69 at the bottom is less than the lateral dimension of each via cavity 69 at the top.

Each via cavity 69 vertically extends from the top surface of the via-level dielectric material layer 33A to a top surface of a respective one of the first conductive line (which may comprise a second metal line 42L). Each via cavity 69 has a closed upper periphery, i.e., an upper periphery having a closed two-dimensional shape such as a circle, an oval, or a polygon. Likewise, each via cavity 69 has a closed lower periphery, i.e., a lower periphery having a closed two-dimensional shape. Each upper periphery may be adjoined to the top surface of the via-level dielectric material layer 33A, and each lower periphery may be adjoined to a top surface of a respective first conductive line.

At least one straight sidewall vertically extends from the closed upper periphery of each via cavity 69 (located at the horizontal plane including the top surface of the via-level dielectric material layer 33A) to the closed lower periphery of the via cavity 69 (which is adjoined to a top surface of a first conductive structure). If a via cavity 69 has a rounded horizontal cross-sectional shape, such as a circular horizontal cross-sectional shape or an oval horizontal cross-sectional shape, a single straight sidewall may vertically extend from the closed upper periphery of the via cavity 69 to the closed lower periphery of the via cavity 69. If a via cavity 69 has a polygonal horizontal cross-sectional shape or a rounded polygonal cross-sectional shape, such as a rectangular horizontal cross-sectional shape or a rounded rectangular horizontal cross-sectional shape, multiple straight sidewall may vertically extend from the closed upper periphery of the via cavity 69 to the closed lower periphery of the via cavity 69. A straight sidewall refers to a sidewall having a straight vertical cross-sectional profile. Each straight sidewall of each via cavity 69 may have a uniform taper angle, which may be in a range from 0.1 degree to 10 degrees, and/or in a range from 0.2 degree to 7 degrees, and/or in a range from 0.5 degree to 4 degrees.

Each row of via cavities 69 within the two-dimensional array of via cavities 69 may be formed over a respective one of the first conductive lines. The entirety of each bottom surface of the via cavities 69 may be located within the top surface of a respective one of the first conductive lines. The closed upper periphery of each via cavity 69 has a greater area than the closed lower cavity of the same via cavity 69.

Referring to FIGS. 5A and 5B, a barrier material may be optionally formed on each physically exposed surfaces of the first conductive lines at the bottom of each via cavity 69. A two-dimensional array of bottom barrier material plates 61 may be formed on the physically exposed surfaces of the first conductive lines in the via cavities 69. The barrier material comprises a material that may prevent downward diffusion of a material to be subsequently formed in the via cavities 69, which may be a selector material or a memory material. In one embodiment, the barrier material may include a carbon-based material (such as amorphous carbon or diamond-like carbon) that may, or may not, consist essentially of carbon atoms, an elemental metal (such as Ru, Mo, Co, or W) that may be selectively grown from a metallic surface while suppressing growth from dielectric surfaces, or any metallic material (such as TiN, TaN, WN, TiC, TaC, WC, Ti, Ta, W, Ru, Mo, etc.) that may be anisotropically deposited and isotropically etched back. Other suitable materials are within the contemplated scope of disclosure.

In one embodiment, the barrier material may include a carbon-based material that is deposited by a direction deposition method such as collimated physical vapor deposition. In such an embodiment, the thickness of the deposited carbon-based material at the bottom of each via cavity 69 may be greater than the thickness of the deposited carbon-based material on the sidewalls of the via cavities 69. The portions of the carbon-based material on the sidewalls of the via cavities 69 may be etched back using an isotropic etch process. A chemical dry etch process using hydrogen plasma or a plasma of hydrogen-containing gas may be used to etch the portions of the carbon-based material from the sidewalls of the via cavities 69. Remaining portions of the carbon-based material at the bottom of each via cavity 69 (due to a greater thickness of the deposited carbon-based material caused by the direction deposition process) constitute the bottom barrier material plates 61.

Alternatively, a carbon-based barrier material may be selectively deposited by a chemical vapor deposition on metallic surfaces (such as the surfaces of the first conductive lines) while suppressing deposition of carbon on the dielectric surfaces of the via-level dielectric layer 33A. The carbon-based barrier material may be deposited in an amorphous phase, or as small platelets of graphene. Precursor gases such as $CH_4$, $C_2H_6$, $C_2H_4$, or $C_2H_2$ may be used in conjunction with $H_2$ to deposit the carbon-based barrier material. In some embodiments, plasma may be used to accelerate breakdown of the carbon-containing precursor gas at a low temperature.

In one embodiment, the barrier material may include an elemental metal that may be selectively grown from the metallic surfaces of the first conductive lines underlying the via cavities 69 while suppressing growth from dielectric surfaces of the via-level dielectric material layer 33A. Elemental metals that may be selectively grown from the metallic surfaces of the first conductive lines include Ru, Mo, Co, and W. For example, ruthenium may be selectively grown from metallic surfaces by an atomic layer deposition process that uses a ruthenium precursor gas such as η4-2, 3-dimethylbutadiene ruthenium tricarbonyl (Ru(DMBD)(CO)$_3$) and a reducing agent such as hydrogen or a hydride gas. Molybdenum may be selectively grown from metallic surfaces by an atomic layer deposition process that uses a molybdenum precursor gas such as molybdenumhexacarbonyl (Mo(CO)$_6$)) and a reducing agent such as hydrogen or a hydride gas. Cobalt may be selectively grown from metallic surfaces by an atomic layer deposition process that uses a cobalt precursor gas such as bis(cyclopentadienyl)cobalt(II) (Co(C$_5$H$_5$)$_2$) and a plasma-generating reducing agent such as hydrogen or a hydride gas. Tungsten may be selectively grown from metallic surfaces by a chemical vapor deposition process that uses tungsten hexafluoride (WF$_6$) as a reactant gas, or a combination of tungsten tetrafluoride (WF$_4$) and hydrgon. The deposited metal portions at the bottom of each via cavity 69 constitute the bottom barrier material plates 61.

In one embodiment, the barrier material may include any metallic material (such as TiN, TaN, WN, TiC, TaC, WC, Ti, Ta, W, Ru, Mo, etc.) that may be anisotropically deposited and isotropically etched back. Other suitable materials are within the contemplated scope of disclosure. For example, a metallic material may be deposited by a collimated physical vapor deposition process to provide a thicker deposited material at the bottom of each via cavity 69 than on sidewalls of the via cavities 69. An isotropic etch-back process may be performed to remove the metallic material from the sidewalls of the via cavities 69 while a remaining portion of the metallic material is present at the bottom each via cavity. The remaining portions of the metallic material at the bottom of each via cavity 69 constitute the bottom barrier material plates 61.

In one embodiment, growth inhibitor molecules may be formed selectively on dielectric surfaces such as the surfaces of the via-level dielectric material layers 33A. Growth inhibitors are molecules (monomers) may adsorb selectively on the dielectric surface to stop the growth. Each monomer includes a head group that facilitates the binding to the surface, an alkyl chain of a certain length that ensures the ordering in a monolayer, and a tail group that determines the character of the surface after functionalization. The selected monomers may adsorb on specific materials and the surface selectivity relies on either selective precursor or co-reactant adsorption. For example, octadecyltrichlorosilane (ODTS) molecules adsorb selectively on OH-terminated SiO2 regions while 1-octadecene molecules adsorb selectively on H-terminated Si surface. Various metal may be selectively deposited using this method. For example, ruthenium may be deposited using (ethylbenzyl) (1-ethyl-1,4-cyclohexadienyl) Ru(0), which is also represented as EBECHRu or C16H22Ru, as a precursor gas and using oxygen as an oxidizing agent. Surfaces coated with this monomer may be treated with hydrogen plasma to form termination groups of —OH and/or —CH3.

Generally, each bottom barrier material plate 61 may have a thickness in a range from 1 nm to 5 nm. The two-dimensional array of bottom barrier material plates 61 may be formed directly on the physically exposed top surfaces of the first conductive lines at the bottom of each via cavity 69. The two-dimensional array of bottom barrier material plates 61 is an optional structure, and as such, may be formed or may be omitted.

Figure 6A:
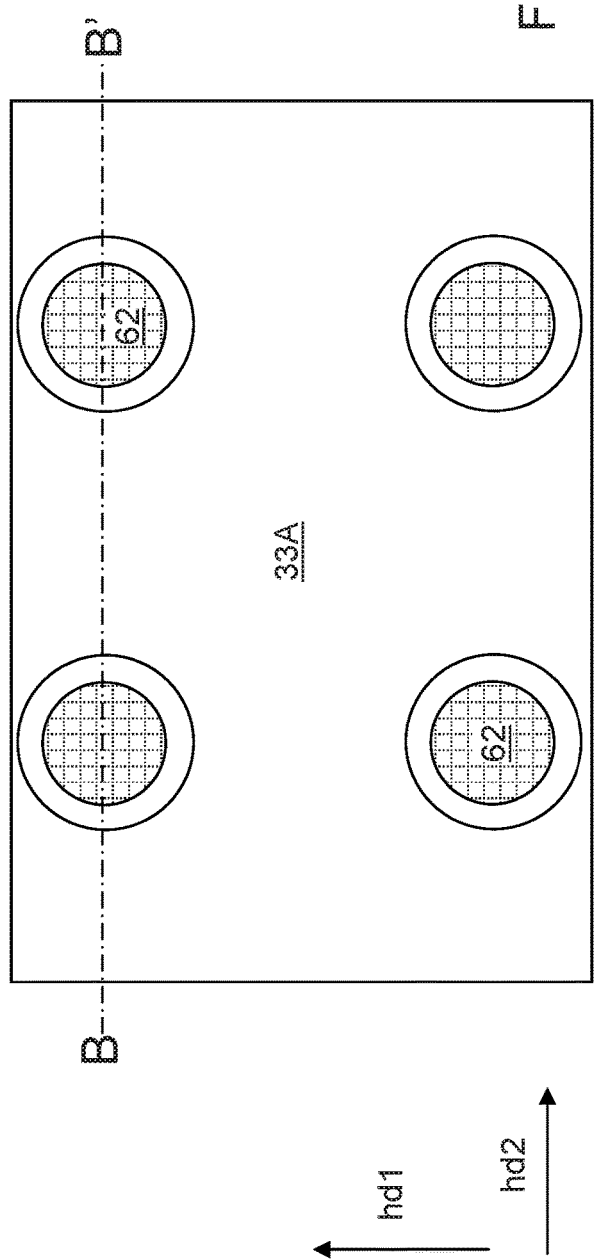
FIG. 6A is a top-down view of the portion of the memory array region after formation of a two-dimensional array of selector material pillars according to the first embodiment of the present disclosure.
Figure 6B:
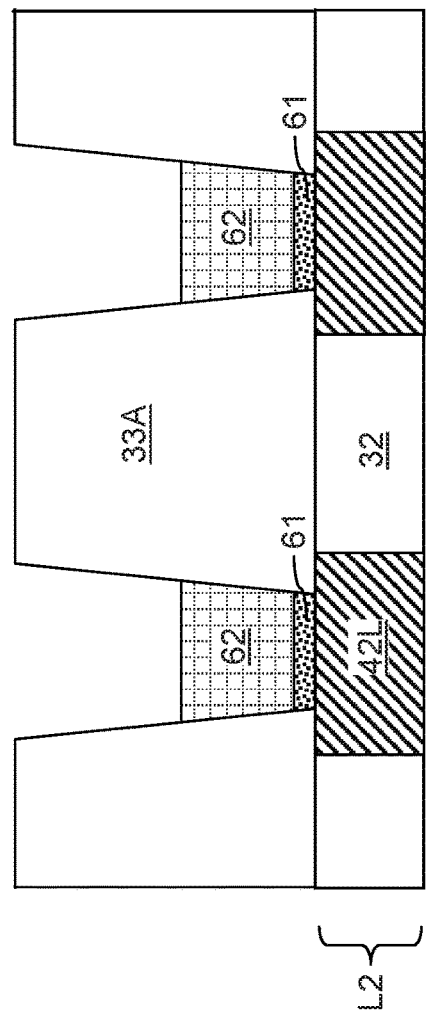
FIG. 6B is a vertical cross-sectional view of the portion of the memory array region along the vertical plane B-B' of FIG. 6A.

Referring to FIGS. 6A and 6B, a two-dimensional array of lower pillar structures may be formed by depositing a lower pillar material. In one embodiment, the lower pillar structures may be formed by performing a selective deposition process that grows the lower pillar material within the via cavities 69 from the top surfaces of underlying material portions while suppressing growth of the lower pillar material from physically exposed surfaces of the via-level dielectric material layer 33A. In embodiments in which the two-dimensional array of bottom barrier material plates 61 is present, the two-dimensional array of lower pillar structures may be grown directly from the physically exposed top surfaces of the two-dimensional array of bottom barrier material plates 61. In embodiments in which the two-dimensional array of bottom barrier material plates 61 is omitted, the two-dimensional array of lower pillar structures may be grown directly from the physically exposed top surfaces of the first conductive lines at the bottom of the two-dimensional array of via cavities 69.

In another embodiment, a two-dimensional array of lower pillar structures may be formed by depositing the lower pillar material in the two-dimensional array of via cavities 69 and over the top surface of the via-level dielectric material layer 33A using a non-selective deposition process, and by vertically recessing the lower pillar material. An isotropic etch process or an anisotropic etch process may be used to vertically recess the lower pillar material. The lower pillar material may be removed from above the top surface of the via-level dielectric material layer 33A and from an upper volume of each via cavity 69. In embodiments in which the two-dimensional array of bottom barrier material plates 61 is present, the two-dimensional array of lower pillar structures may be formed directly on the top surfaces of the two-dimensional array of bottom barrier material plates 61. In embodiments in which the two-dimensional array of bottom barrier material plates 61 is omitted, the two-dimensional array of lower pillar structures may be formed directly on the top surfaces of the first conductive lines at the bottom of the two-dimensional array of via cavities 69.

Generally, the two-dimensional array of lower pillar structures may be formed in lower volumes of the two-dimensional array of via cavities 69. An overlying void may be present above a top surface of a lower pillar structure within each via cavity 69. In one embodiment, an entirety of a periphery of a top surface the lower pillar material may be formed on the at least one straight sidewall of each via cavity 69. In other words, the entirety of a closed upper periphery of a lower pillar structure may be located entirely within the at least one straight sidewall of a respective via cavity 69.

In one embodiment, the lower pillar material comprises, and/or consists of, a selector material. In such an embodiment, the two-dimensional array of lower pillar structures may be a two-dimensional array of selector material pillars 62. A selector material is a material that exhibits a non-linear switching characteristic that may depend on an applied external voltage or hysteresis effects of an applied external voltage. Each selector material pillar 62 may have a variable horizontal cross-sectional shape of which the size strictly increases with an increase in the vertical distance from the top surface of the substrate 8. In other words, each upper segment of a selector material pillar 62 has a greater horizontal cross-sectional area than any underlying segment of the same selector material pillar 62.

In one embodiment, each of the selector material pillars 62 may comprise, and/or may consist essentially of, one of an ovonic threshold switch material, a conductive bridge structure, and a multilayer tunneling barrier stack structure. An ovonic threshold switch material may include a chalcogenide alloy including selenium or tellurium and at least another element such as zinc, germanium, silicon, and optionally includes sulfur and/or nitrogen. The ovonic threshold switch material may be electrically insulating when an electrical bias voltage thereacross is below a threshold voltage, and may be electrically conducting when the electrical bias voltage thereacross is above the threshold voltage. A conductive bridge structure may be a structure that allows formation of conductive filaments in a thin solid electrolyte film between a first inert electrode (such as a tungsten electrode or a nickel electrode) and a second electrochemically active electrode (such as a silver electrode or a copper electrode). The conductive bridge structure displays low resistance state when filaments are present in the solid electrolyte, and displays high resistance when filaments are absent in the solid electrolyte. The multilayer tunneling barrier stack structure includes a stack of multiple material layers that displays non-linear switching characteristics like the ovonic threshold switch material. An exemplary multilayer tunneling barrier stack structure includes a layer stack of $Ta_2O_5$, $TaO_x$, and $TiO_2$ described in Woo et al., *Multi-layer Tunnel Barrier ($Ta_2O_5/TaO_x/TiO_2$) Engineering for Bipolar RRAM selector applications,* 12-4, Digest of Technical Papers—Symposium on VLSI Technology, January 2013.

In embodiments in which each of the selector material pillars 62 comprises, and/or consists essentially of, an ovonic threshold switch material, the ovonic threshold switch material may be selectively grown using a chemical vapor deposition process. For example, precursor gases for germanium, selenium, and/or tellurium may be flowed into a process chamber to induce selective deposition of a germanium-selenium compound, a germanium-tellurium compound, or a germanium-selenium-tellurium compound. In one embodiment, an etchant gas may be intermittently flowed to enhance selectivity of the growth process. In another embodiment, a self-assembled monolayer that inhibits deposition of the ovonic threshold switch material may be selectively coated on the physically exposed surfaces of the via-level dielectric material layer 33A without coating the physically exposed surfaces of the bottom barrier material plates 61 or physically exposed surfaces of the first conductive lines.

In embodiments in which each of the selector material pillars 62 comprises, and/or consists essentially of, a conductive bridge structure, the component layers of the conductive bridge structure may be anisotropically deposited, for example, using a respective collimated physical vapor deposition process. Deposited materials on the sidewalls of the via cavities 69 may be etched back using a respective isotropic etch process. A combination of an anisotropic deposition process and an etch back process may be repeated for each component layer of the conductive bridge structure to provide the conductive bridge structure in each via cavity 69.

In embodiments in which each of the selector material pillars 62 comprises, and/or consists essentially of, a multilayer tunneling barrier stack structure, the metallic components of the multilayer tunneling barrier stack structure may be anisotropically deposited, for example, using a respective collimated physical vapor deposition process. Deposited metallic materials on the sidewalls of the via cavities 69 may be etched back using a respective isotropic etch process. An oxidation process may be performed on the remaining portions of the deposited metallic material at the bottom of each via cavity 69. A combination of an anisotropic deposition process, an etch back process, and an oxidation process may be repeated for each component layer of the conductive bridge structure to provide the conductive bridge structure in each via cavity 69.

Generally, the selector material pillars 62 may have a thickness in a range from 4 nm to 30 nm, such as from 5 nm to 20 nm. The two-dimensional array of selector material pillars 62 may be formed directly on the two-dimensional array of bottom barrier material plates 61. Alternatively, the two-dimensional array of selector material pillars 62 may be formed directly on the top surfaces of the first conductive lines in embodiments in which the two-dimensional array of bottom barrier material plates 61 is omitted.

Referring to FIGS. 7A and 7B, a two-dimensional array of intermediate barrier material plates 63 may be optionally formed on the top surfaces of the two-dimensional array of lower pillar structures, which may be the two-dimensional array of selector material pillars 62. The two-dimensional array of intermediate barrier material plates 63 includes a barrier material that may block interdiffusion of materials between a vertically-neighboring pair of a selector material pillar 62 and a memory material pillar to be subsequently formed. In one embodiment, the two-dimensional array of intermediate barrier material plates 63 may include any material that may be used for the two-dimensional array of bottom barrier material plates 61.

In one embodiment, the two-dimensional array of intermediate barrier material plate 63 may be formed by a selective barrier material deposition process that grows a barrier material from the top surfaces of the two-dimensional array of lower pillar structures (such as the two-dimensional array of selector material pillars 62) while suppressing growth of the barrier material from the top surface or any sidewall of the via-level dielectric material layer 33A. Generally, the top surfaces of the selector material pillars 62 may function as metallic surfaces that enable selective growth of the materials that may be used for the bottom barrier material plates 61.

In another embodiment, the two-dimensional array of intermediate barrier material plates 63 may be formed by performing an anisotropic deposition that deposits a barrier material with a greater thickness on horizontal surfaces than on vertical surfaces, and by isotropically etching vertically-extending portions of the barrier material from sidewalls of the via-level dielectric material layer 33A. In embodiments in which any of the materials for the bottom barrier material plates 61 is used for the two-dimensional array of intermediate barrier material plates 63, the processing steps used to form the two-dimensional array of bottom barrier material plates 61 may be used to form the two-dimensional array of intermediate barrier material plates 63.

A closed periphery of a top surface of each intermediate barrier material plate 63 may be formed entirely on the at least one straight sidewall of a respective via cavity 69. The closed periphery of the top surface of each intermediate barrier material plate 63 is vertically spaced from an upper periphery of a respective underlying lower pillar structure, such as a respective underlying selector material pillar 62.

Generally, each intermediate barrier material plate 63 may have a thickness in a range from 3 nm to 20 nm. The two-dimensional array of intermediate barrier material plates 63 is an optional structure, and as such, may be formed or may be omitted. If the two-dimensional array of intermediate barrier material plates 63 is present, interdiffusion of the material of the lower pillar structures (such as the selector material pillars 62) and the material of upper pillar structures to be subsequently formed may be suppressed, and the yield and the reliability of the memory devices may be significantly enhanced.

Referring to FIGS. 8A and 8B, a two-dimensional array of upper pillar structures may be formed by depositing an upper pillar material in an upper portion of each via cavity 69. In one embodiment, a two-dimensional array of upper pillar structures may be formed by performing a selective deposition process that grows the upper pillar material within the via cavities from the top surfaces of a two-dimensional array of underlying material portions while suppressing growth of the upper pillar material from physically exposed surfaces of the via-level dielectric material layer 33A. In embodiments in which the two-dimensional array of intermediate barrier material plates 63 is present, the two-dimensional array of lower pillar structures may be grown directly from the physically exposed top surfaces of the two-dimensional array of intermediate barrier material plates 63. In embodiments in which the two-dimensional array of intermediate barrier material plates 63 is omitted, the two-dimensional array of lower pillar structures may be grown directly from the physically exposed top surfaces of the two-dimensional array of lower pillar structures such as the two-dimensional array of selector material pillars 62.

In another embodiment, a two-dimensional array of upper pillar structures may be formed by depositing the upper pillar material in vacant volumes of the two-dimensional array of via cavities 69 and over the top surface of the via-level dielectric material layer 33A using a non-selective deposition process, and by vertically recessing the upper pillar material. An isotropic etch process or an anisotropic etch process may be used to vertically recess the upper pillar material. The upper pillar material may be removed from above the top surface of the via-level dielectric material layer 33A. In one embodiment, the upper pillar material may be vertically recessed below the horizontal plane including the top surface of the via-level dielectric material layer 33A. In embodiments in which the two-dimensional array of intermediate barrier material plates 63 is present, the two-dimensional array of lower pillar structures may be formed directly on the physically exposed top surfaces of the two-dimensional array of intermediate barrier material plates 63. In embodiments in which the two-dimensional array of intermediate barrier material plates 63 is omitted, the two-dimensional array of lower pillar structures may be formed directly on the physically exposed top surfaces of the two-dimensional array of lower pillar structures such as the two-dimensional array of selector material pillars 62.

Generally, the two-dimensional array of upper pillar structures may be formed in upper volumes of the two-dimensional array of via cavities 69. Top surfaces of the upper pillar structures may be recessed below the horizontal plane including the top surface of the via-level dielectric material layer 33A if a two-dimensional array of top barrier material plates is to be subsequently formed. Top surfaces of the upper pillar structures may be coplanar with the top surface of the via-level dielectric material layer 33A if a two-dimensional array of top barrier material plates is not to be subsequently formed. In one embodiment, an entirety of a periphery of a top surface the upper pillar material may be formed on the at least one straight sidewall of each via cavity 69. In other words, the entirety of a closed upper periphery of an upper pillar structure may be located entirely within the at least one straight sidewall of a respective via cavity 69.

In one embodiment, the upper pillar material comprises, and/or consists of, a selector material. In such an embodiment, the two-dimensional array of upper pillar structures may be a two-dimensional array of memory material pillars 64. In one embodiment, each memory material pillar 64 may include a resistive memory material that has at least two different resistive states providing different electrical resistance. In one embodiment, the memory material pillars 64 comprise, and/or consist essentially of, a material selected from a phase change memory material and an oxygen vacancy-modulated resistive material.

A phase change memory material is a material that may provide at least two different resistive states depending on the crystalline structure. A non-limiting exemplary phase change memory material includes a germanium-antimony-tellurium (GST) alloy that provides a low resistance state in a polycrystalline phase and a high resistance state in an amorphous phase.

In embodiments in which a GST alloy is used as the memory material of the memory material pillars 64, the GST alloy may be selectively grown from the physically exposed surfaces of the two-dimensional array of intermediate barrier material plates 63 or the two-dimensional array of selector material pillars 62 by a selective growth process. Precursor gasses for germanium, antimony, and tellurium may be sequentially or simultaneously flowed into a process chamber in an atomic layer deposition process or a chemical vapor deposition process. In one embodiment, $Ge(i-C_4H_9)_4$, $Sb(i-C_3H_7)_3$, and $Te(i-C_3H_7)_2$ may be used as a germanium precursor, an antimony precursor, and a tellurium precursor, respectively. The precursor gases preferentially nucleate on the metallic surfaces of the two-dimensional array of intermediate barrier material plates 63 or the two-dimensional array of selector material pillars 62, while nucleation on the surfaces of the via-level dielectric material layer 33A is suppressed or retarded. Optionally, an etchant gas may be flowed into the process chamber simultaneously or alternately with the flow of the precursor gasses for germanium, antimony, and tellurium.

Optionally, a self-assembled monolayer including a growth inhibitor may be used. The growth inhibitor may include the same material as the growth inhibitor that suppresses deposition of the barrier material during formation of the bottom barrier material plates 61 as discussed above. The growth inhibitor inhibits nucleation of the precursor gasses may be selectively formed on the physically exposed surfaces of the via-level dielectric material layer 33A. In such an embodiment, the molecules of the self-assembled monolayer may include a head group that is attached to the physically exposed surfaces of the via-level dielectric material layer 33A through molecular adhesion without attaching itself to the physically exposed surfaces of the physically exposed surfaces of the two-dimensional array of intermediate barrier material plates 63 or the two-dimensional array of selector material pillars 62. The molecules of the self-assembled monolayer may include a tail group that inhibits adhesion of any metallic precursor material.

Alternatively, the phase change memory material may be deposited by a non-selective deposition process, and excess portions of the phase change memory material may be removed from above the horizontal plane including the top surface of the via-level dielectric material layer by a recess etch.

An oxygen vacancy-modulated resistive material is a material that provides different resistive states depending on the spatial distribution of oxygen vacancies that migrate under electrical bias. An oxygen vacancy-modulated resistive material may provide a low resistance state having a narrow oxygen depletion region and a high resistance state having a wide oxygen depletion region depending on the history of the external electrical bias voltage thereacross. Non-limiting examples of the oxygen vacancy-modulated resistive materials include hafnium oxide, tantalum oxide, aluminum oxide, and titanium oxide.

The oxygen vacancy-modulated resistive material may be deposited by a non-selective deposition process to fill the entire volume of each via cavity 69. Excess portions of the oxygen vacancy-modulated resistive material may be removed from above the horizontal plane including the top surface of the via-level dielectric material layer 33A by a recess etch process. In embodiments in which the oxygen vacancy-modulated resistive material may be deposited by a selective deposition process such as atomic layer deposition process or a chemical vapor deposition process, such a selective deposition may be used to form the memory material pillars 64. In an illustrative example, selective atomic layer deposition of hafnium oxide may be effected using tetrakis diethylamino hafnium (TDEAH) and water vapor as precursor gases. Growth of hafnium oxide does not occur on dielectric surfaces such as silicon oxide surfaces.

Generally, the memory material pillars 64 may have a thickness in a range from 6 nm to 50 nm, such as from 10 nm to 30 nm. The two-dimensional array of memory material pillars 64 may be formed directly on the two-dimensional array of intermediate barrier material plates 63. Alternatively, the two-dimensional array of memory material pillars 64 may be formed directly on the top surfaces of the two-dimensional array of selector material pillars 62 in embodiments in which the two-dimensional array of intermediate barrier material plates 63 is omitted.

Referring to FIGS. 9A and 9B, a barrier material may be optionally formed on each physically exposed surfaces of the two-dimensional array of upper pillar structures such as the two-dimensional array of memory material pillars 64. A two-dimensional array of top barrier material plates 65 may be formed in the topmost volumes of the via cavities 69. The barrier material comprises a material that may prevent upward diffusion of the material of the upper pillar structures such as the material of the memory material pillars 64. Any of the materials that may be used for the bottom barrier material plates 61 may be used for the top barrier material plates 65. Accordingly, any of the deposition methods for forming the two-dimensional array of bottom barrier material plates 61 may be used to form the two-dimensional array of top barrier material plates 65.

Generally, each top barrier material plate 65 may have a thickness in a range from 1 nm to 5 nm. The two-dimensional array of top barrier material plates 65 may be formed directly on the physically exposed top surfaces of the two-dimensional array of memory material pillars 64 at the top of each via cavity 69. The two-dimensional array of top barrier material plates 65 is an optional structure, and as such, may be formed or may be omitted.

The set of all material portions formed within a via cavity 69 constitutes a pillar stack structure (61, 62, 63, 64, 65). Each pillar stack structure (61, 62, 63, 64, 65) may include an optional bottom barrier material plate 61, a selector material pillar 62, an optional intermediate barrier material plate 63, a memory material pillar 64, and an optional top barrier material plate 65. A two-dimensional array of pillar stack structures (61, 62, 63, 64, 65) in a two-dimensional array of via cavities 69 by sequentially forming a set of material portions within each of the two-dimensional array of via cavities 69.

In some embodiments, the locations of the selector material pillar 62 and the memory material pillar 64 in each pillar stack structure (61, 62, 63, 64, 65) may be exchanged. In such embodiments, the memory material pillar 64 may be formed as a lower pillar structure, and the selector material pillar 62 may be formed as an upper pillar structure. Generally, each pillar stack structure (61, 62, 63, 64, 65) comprises a set of vertically-stacked material portions that includes a respective lower pillar structure and a respective upper pillar structure. One of the respective lower pillar structure and the respective upper pillar structure comprises a selector material pillar 62 exhibiting a non-linear switching characteristic, and another of the respective lower pillar structure and the respective upper pillar structure comprises a memory material pillar 64 comprising a memory material.

In one embodiment, each sidewall within the via cavities 69 may be straight, and may have a non-zero taper angle, which may be in a range from 0.1 degree to 10 degrees, and/or may be in a range from 0.2 degrees to 7 degrees, and/or may be in a range from from 0.5 degrees 4 degrees. As such, each pillar stack structure (61, 62, 63, 64, 65) has a reverse-tapered configuration. It is understood that typical material portions formed by a combination of a lithographic masking process and a microelectronic etch process has a taper angle such that a bottom portion of a patterned structure has a greater lateral dimension than a top portion of the patterned structure. According to an embodiment of the disclosure, the via-level dielectric material layer 33A is patterned with a combination of a lithographic masking process and an etch process, and thus, the via-level dielectric material layer 33A has a greater width at the bottom than at the top. Correspondingly, the via cavities 69 have a greater width at the top than at the bottom. Each pillar stack structure (61, 62, 63, 64, 65) is formed by filling a respective via cavity 69, and thus, has a greater width at the top than at the bottom. Thus, the sidewalls of the pillar stack structures (61, 62, 63, 64, 65) have a respective reverse-taper angle, i.e., a taper angle that causes the top portion to be wider than the bottom portion.

In one embodiment, the taper angle of each via cavity 69 may be uniform, and the reverse-taper angle of each pillar stack structure (61, 62, 63, 64, 65) may be uniform. In one embodiment, the entirety of the at least one sidewall of each via cavity 69 may be contained within the plane of a geometrical cone having an apex located at a point at which an extension of the at least one sidewall converges. In an illustrated example, each pillar stack structure (61, 62, 63, 64, 65) includes a single conical sidewall intersecting, and extending from, a horizontal plane including the top surface of the via-level dielectric material layer 33A and intersecting, and extending to, a horizontal plane including top surfaces of the first conductive lines (which contact a respective bottom surface of the pillar stack structures (61, 62, 63, 64, 65). Each pillar stack structure (61, 62, 63, 64, 65) functions as a selector-memory element.

Referring to FIGS. 10A and 10B, a second dielectric material layer 33B may be formed over the two-dimensional array of pillar stack structures (61, 62, 63, 64, 65). The second dielectric material layer 33B may be formed as an upper component of the third interconnect-level dielectric layer 33. In such an embodiment, the combination of the via-level dielectric material layer 33A and the second dielectric material layer 33B may constitute the third interconnect-level dielectric layer 33. The dielectric material of the second dielectric material layer 33B is herein referred to as a line-level dielectric material. The line-level dielectric material may include undoped silicate glass, a doped silicate glass (such as borosilicate glass, phosphosilicate glass, or fluorosilicate glass), or organosilicate glass. The second dielectric material layer 33B may be formed by chemical vapor deposition (CVD) or by spin-coating. The thickness of the second dielectric material layer 33B may be in a range from 50 nm to 200 nm, although lesser and greater thicknesses may also be used.

Referring to FIGS. 11A and 11B, a first photoresist layer (not shown) may be applied over the second dielectric material layer 33B, and may be lithographically patterned to form openings in the peripheral region 200. The openings in the first photoresist layer may be formed over a respective one of the second metal lines 42L in the peripheral region 200. A first anisotropic etch process may be performed to transfer the pattern of the openings through the second dielectric material layer 33B and partly or fully through the via-level dielectric material layer 33A. Via cavities for forming second metal via structures 43V may be formed in the peripheral region 200. The first photoresist layer may be removed, for example, by ashing.

A second photoresist layer may be applied over the second dielectric material layer 33B and may be lithographically patterned to form a pattern of line-shaped openings. The line-shaped opening overlie the via cavities that are present in the peripheral region 200 and each of the pillar stack structures (61, 62, 63, 64, 65) within the two-dimensional array of pillar stack structures (61, 62, 63, 64, 65). As such, portions of the second photoresist layer are removed from inside each via cavity in the peripheral region 200 and from above each pillar stack structure (61, 62, 63, 64, 65).

A second anisotropic etch process is performed to transfer the pattern of the line-shaped openings in the second photoresist layer through the second dielectric material layer 33B. If the via cavities in the peripheral region 200 as formed by the first anisotropic etch process do not extend to top surfaces of the second metal lines 42L in the peripheral region 200, the via cavities may be extends to the top surfaces of the second metal lines 42L in the peripheral region by the second anisotropic etch process. The second anisotropic etch process forms line trenches that are adjoined to the via cavities in the peripheral region 200. As such, integrated line and via cavities are formed in the peripheral region 200. A top surface of at least one second metal line 42L may be physically exposed at the bottom of each integrated line and via cavity in the peripheral region 200.

The second anisotropic etch process forms an array of line trenches over the two-dimensional array of pillar stack structures (61, 62, 63, 64, 65) in the memory array region 100. Each line trench in the memory array region 100 may laterally extend along the second horizontal direction. A column of pillar stack structures (61, 62, 63, 64, 65) may be physically exposed at the bottom of each line trench in the memory array region 100.

At least one conductive material may be deposited into the integrated line and via cavities in the peripheral region 200 and into the line trenches in the memory array region 100. The at least one conductive material may include a metallic liner layer (such as a TiN liner, a TaN liner, or a WN liner), and a metallic fill material (such as Cu, Al, or W). Excess portions of the at least one conductive material may be removed from above the top surface of the second dielectric material layer 33B by a planarization process such as a chemical mechanical planarization process. Each remaining portion of the at least one conductive material that fills an integrated line and via cavity in the peripheral region 200 constitutes an integrated line and via structure that includes a third metal line 43L and at least one second metal via structure 43V as illustrated in FIG. 1C. Each remaining portion of the at least one conductive material that fills the line trenches constitutes a second conductive line, which is a subset of the third metal lines 43L. The second conductive lines may be formed in the memory array region 100, and may laterally extend along the second horizontal direction hd2 as illustrated in FIGS. 11A and 11B. The pitch of the second conductive lines along the first horizontal direction hd1 may be the same as the pitch of the two-dimensional array of pillar stack structures (61, 62, 63, 64, 65) along the first horizontal direction hd1.

Generally, the second conductive lines (comprising a subset of the third metal lines 43L) may be parallel to one another, may laterally extend along a different direction than the lengthwise direction of the first conductive lines, and may be embedded in a second dielectric material layer. The second conductive lines may be formed on a respective column of pillar stack structures (61, 62, 63, 64, 65) selected from the two-dimensional array of pillar stack structures (61, 62, 63, 64, 65). In one embodiment, the first conductive lines (comprising a subset of the second metal lines 42L) may laterally extend along the first horizontal direction hd1, and the second conductive lines (comprising a subset of the third metal lines 43L) may laterally extending along the second horizontal direction hd2 that is different from the first horizontal direction hd1, and may be perpendicular to the first horizontal direction hd1.

Referring to FIGS. 12A and 12B, a portion of the memory array region 100 according to a second embodiment of the present disclosure is illustrated. The exemplary structure illustrated in FIGS. 12A and 12B may be derived from the exemplary structure of FIGS. 5A and 5B by forming a two-dimensional array of memory material pillars 64 as a two-dimensional array of lower pillar structures. In other words, the memory material pillars 64 may be formed as lower pillar structures in lieu of the selector material pillars 62 that are used at the processing steps of FIGS. 6A and 6B. Any of the deposition methods for forming the memory material pillars 64 as described above may be used to form the two-dimensional array of memory material pillars 64. As discussed above, the memory material pillars 64 may comprise, and/or may consist essentially of, a material selected from a phase change memory material and an oxygen vacancy-modulated resistive material.

Referring to FIGS. 13A and 13B, the processing steps of FIGS. 7A and 7B may be performed to form a two-dimensional array of intermediate barrier material plates 63.

Figure 14A:
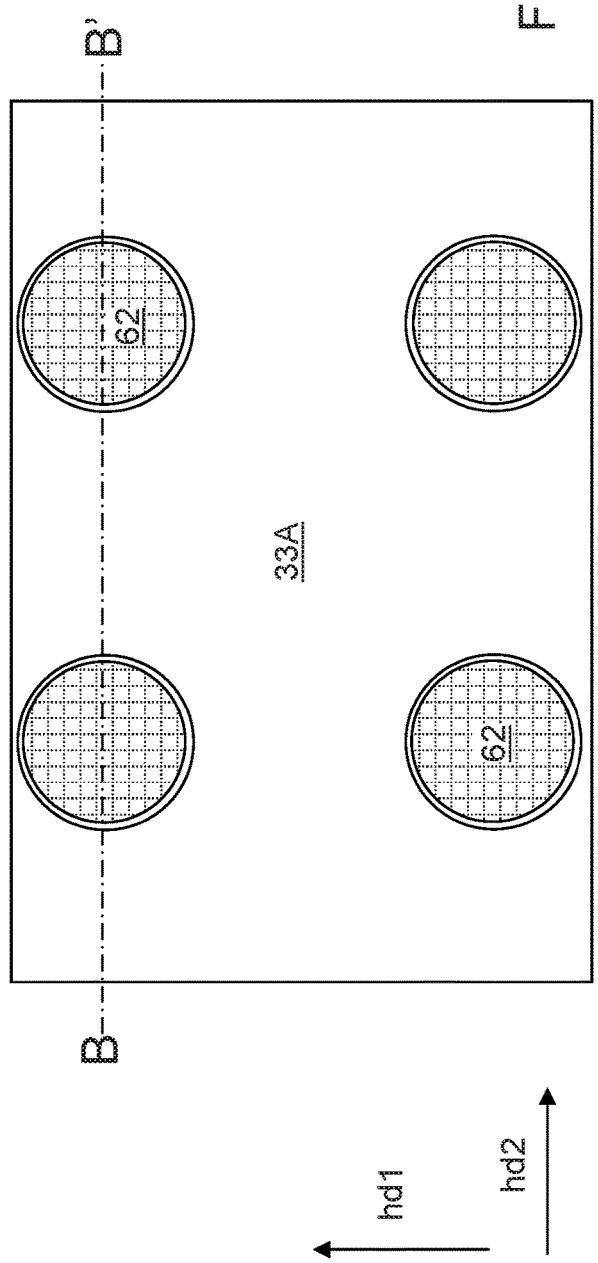
FIG. 14A is a top-down view of the portion of the memory array region after formation of a two-dimensional array of selector material pillars according to the second embodiment of the present disclosure.
Figure 14B:
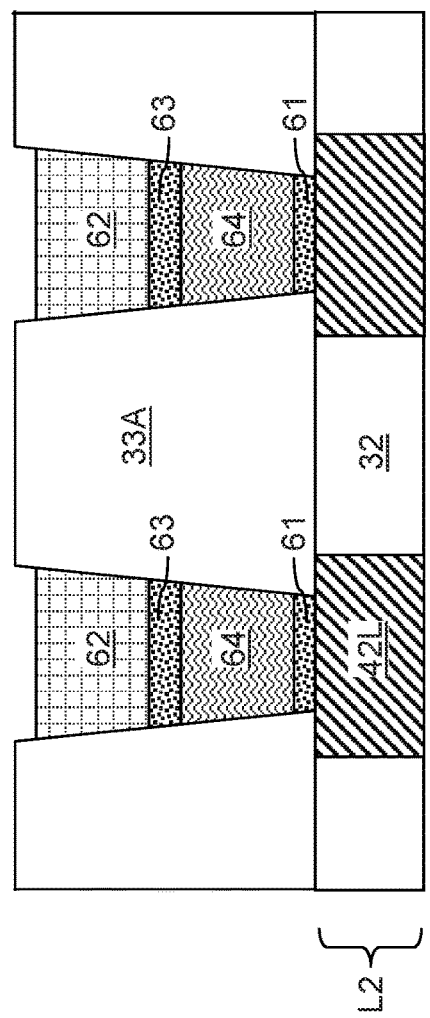
FIG. 14B is a vertical cross-sectional view of the portion of the memory array region along the vertical plane B-B' of FIG. 14A.

Referring to FIGS. 14A and 14B, a two-dimensional array of selector material pillars 62 may be formed as a two-dimensional array of upper pillar structures. In other words, the selector material pillars 62 are formed as upper pillar structures directly on the two-dimensional array of intermediate barrier material plates 63 or directly on the two-dimensional array of memory material pillars 64 (in embodiments in which the intermediate barrier material plates 63 are not used). Any of the deposition methods for forming the selector material pillars 62 as described above may be used to form the two-dimensional array of selector material pillars 62. As discussed above, the selector material pillars 62 may comprise, and/or may consist essentially of, one of an ovonic threshold switch material, a conductive bridge structure, and a multilayer tunneling barrier stack structure.

Referring to FIGS. 15A and 15B, the processing steps of FIGS. 9A and 9B may be performed to form a two-dimensional array of top barrier material plates 65.

Referring to FIGS. 16A and 16B, the processing steps of FIGS. 10A and 10B may be performed to form a second dielectric material layer 33B.

Referring to FIGS. 17A and 17B, the processing steps of FIGS. 11A and 11B may be performed to form integrated line and via structures in the peripheral region 200 and second conductive lines (comprising third metal lines 43L) in the memory array region 100. Each integrated line and via structure may include a third metal line 43L and at least one second metal via structure 43V as illustrated in FIG. 1C. The second conductive lines are formed in the memory array region 100, and may laterally extend along the second horizontal direction hd2 as illustrated in FIGS. 17A and 17B. The pitch of the second conductive lines along the first horizontal direction hd1 may be the same as the pitch of the two-dimensional array of pillar stack structures (61, 62, 63, 64, 65) along the first horizontal direction hd1.

Figure 18:
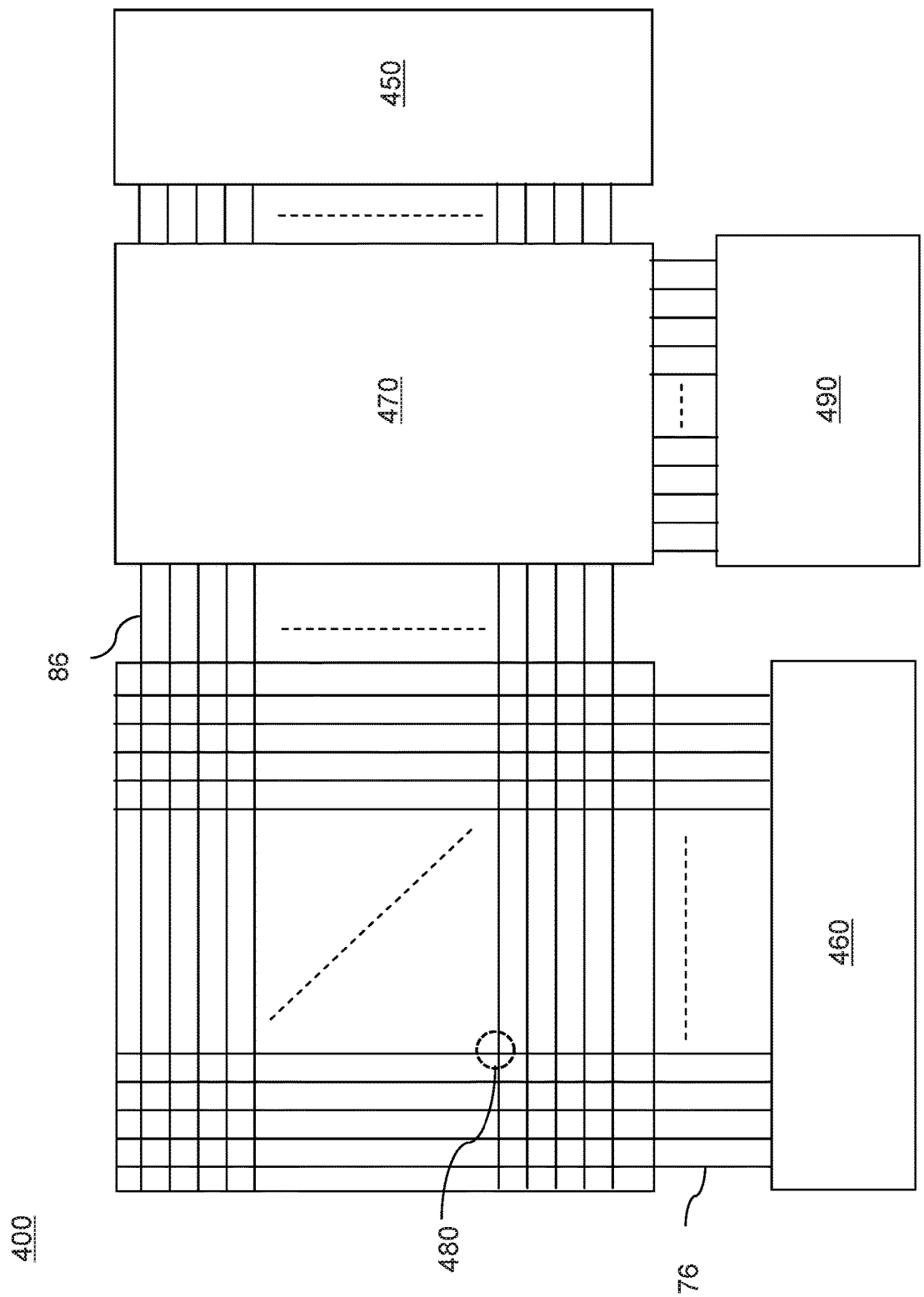
FIG. 18 is a schematic diagram of a resistive random access memory array according to an embodiment of the present disclosure.

Referring to FIG. 18, a schematic diagram of a resistive random access memory (RRAM) device 400 according to an embodiment of the present disclosure is illustrated. The RRAM device 400 may incorporate a two-dimensional array 101 of selector-memory elements 480 described above. Each selector-memory element 480 may include a respective pillar stack structure (61, 62, 63, 64, 65) that is located within a neighboring pair of a word line 76 and a bit line 86. Each word line 76 includes a first conductive line, which may comprise a second metal line 42L or any metal line located at another level. Each bit line includes a second conductive line, which may comprise a third metal line 43L or any metal line located immediately above or immediately below the metal line that functions as a word line 76.

The RRAM device 400 of an embodiment of the present disclosure may also contain a row decoder 460 connected to the word lines 76, a sense circuitry 470 (e.g., a sense amplifier and other bit line control circuitry) connected to the bit lines 86, a column decoder 450 connected to the bit lines 86 through the sense circuitry 470, and a data buffer 490 connected to the sense circuitry 470. The configuration of the RRAM device 400 of the present disclosure is only exemplary, and other configurations may also be used for the RRAM device of the present disclosure.

Figure 19:
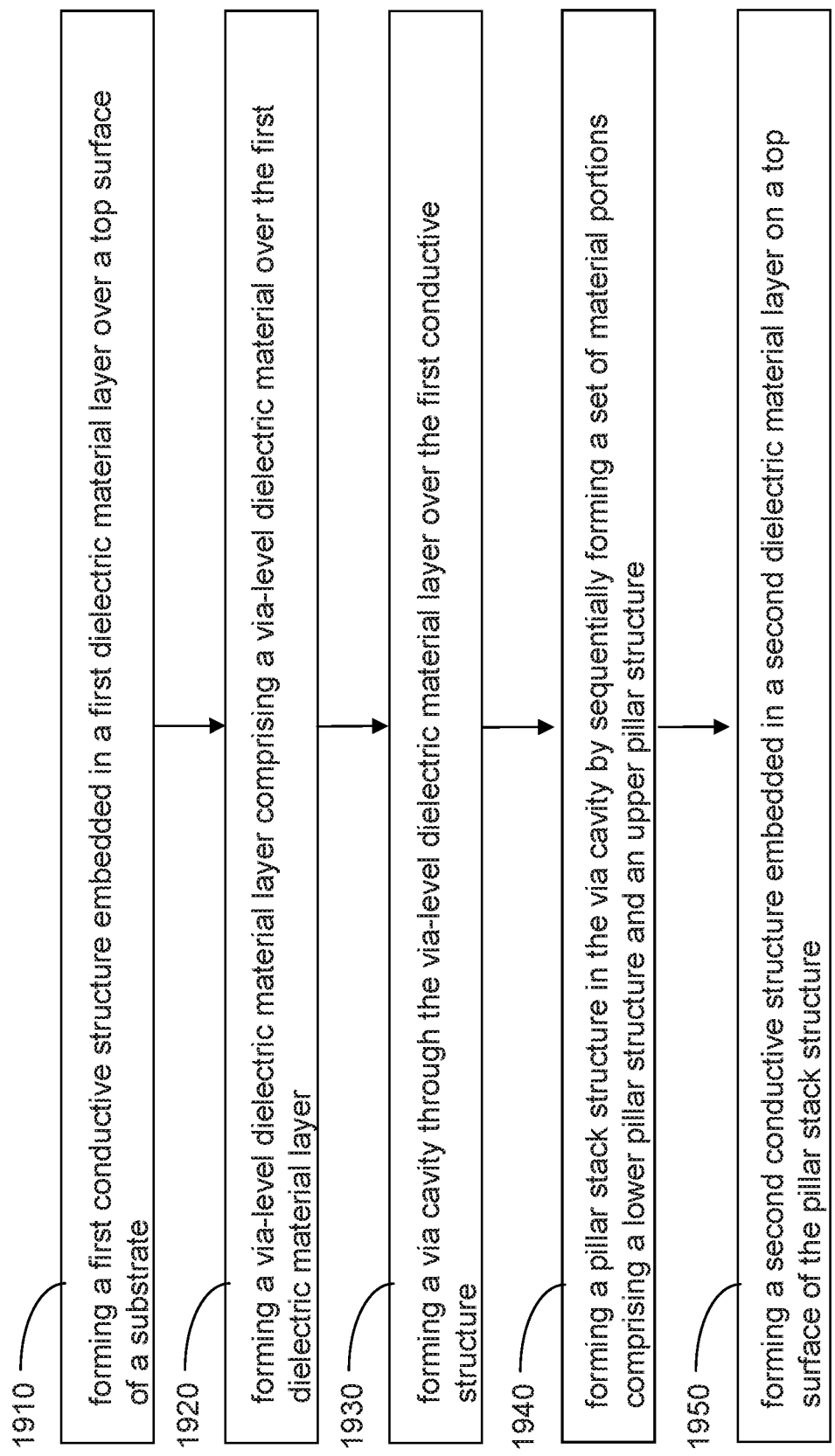
FIG. 19 is a flowchart that illustrates the general processing steps of the methods of the present disclosure.

Referring to FIG. 19, a flowchart illustrates the general processing steps of the methods forming a memory device according to embodiments of the present disclosure. Referring to step 1910, a first conductive structure (such as a second metal line 42L) embedded in a first dielectric material layer (such as a second interconnect-level dielectric layer 32) may be formed over a top surface of a substrate 8. Referring to step 1920, a via-level dielectric material layer 33A comprising a via-level dielectric material may be formed over the first dielectric material layer. Referring to step 1930, a via cavity 69 may be formed through the via-level dielectric material layer 33A over the first conductive structure. At least one straight sidewall vertically extends from a closed upper periphery of the via cavity 69 located at a horizontal plane including a top surface of the via-level dielectric material layer 33A to a closed lower periphery of the via cavity 69 that is adjoined to a top surface of the first conductive structure. Referring to step 1940, a pillar stack structure (61, 62, 63, 64, 65) may be formed in the via cavity 69 by sequentially forming a set of material portions comprising a lower pillar structure and an upper pillar structure. One of the lower pillar structure and the upper pillar structure comprises a selector material pillar 62 exhibiting a non-linear switching characteristic and another of the lower pillar structure and the upper pillar structure comprises a memory material pillar 64 comprising a memory material. Referring to step 1950, a second conductive structure (such as a third metal line 43L) embedded in a second dielectric material layer 33B may be formed on a top surface of the pillar stack structure (61, 62, 63, 64, 65).

According to an embodiment of the present disclosure, a method of forming a memory device is provided, which comprises: forming first conductive lines (such as second metal lines 42L) that are parallel to one another and embedded in a first dielectric material layer (such as a second interconnect-level dielectric layer 32) over a top surface of a substrate 8; forming a via-level dielectric material layer 33A comprising a via-level dielectric material over the first dielectric material layer; forming a two-dimensional array of via cavities 69 through the via-level dielectric material layer 33A, wherein each row of via cavities 69 within the two-dimensional array is formed over a respective one of the first conductive lines; forming a two-dimensional array of pillar stack structures (61, 62, 63, 64, 65) in the two-dimensional array of via cavities 69, wherein each set of material portions comprises a respective lower pillar structure and a respective upper pillar structure that may be formed by depositing and vertically recessing a respective material within a respective one of the via cavities 69, wherein one of the respective lower pillar structure and the respective upper pillar structure comprises a selector material pillar 62 exhibiting a non-linear switching characteristic and another of the respective lower pillar structure and the respective upper pillar structure comprises a memory material pillar 64 comprising a memory material; and forming second conductive lines (such as third metal lines 43L) that are parallel to one another, laterally extending along a different direction than a lengthwise direction of the first conductive lines, and embedded in a second dielectric material layer 33B on a respective column of pillar stack structures (61, 62, 63, 64, 65) selected from the two-dimensional array of pillar stack structures (61, 62, 63, 64, 65).

In one embodiment, each of the selector material pillars 62 comprises, and/or consists essentially of, one of an ovonic threshold switch material, a conductive bridge structure, and a multilayer tunneling barrier stack structure; and each of the memory material pillars 64 comprises, and/or consists essentially of, a material selected from a phase change memory material and an oxygen vacancy-modulated resistive material.

Referring to all drawings and according to various embodiments of the present disclosure, a memory device is provided, which comprises: first conductive lines (such as second metal lines 42L) laterally extending along a first horizontal direction hd1 and embedded in a first dielectric material layer (such as a second interconnect-level dielectric layer 32) located over a top surface of a substrate 8; a via-level dielectric material layer 33A comprising a via-level dielectric material and located over the first dielectric material layer; a two-dimensional array of pillar stack structures (61, 62, 63, 64, 65) embedded in the via-level dielectric material layer 33A, wherein each row of pillar stack structures (61, 62, 63, 64, 65) contacts a respective one of the first conductive lines, and each pillar stack structure (61, 62, 63, 64, 65) within the two-dimensional array of pillar stack structures (61, 62, 63, 64, 65) comprises at least one straight retro-tapered sidewall that vertically extends from a top surface of the via-level dielectric material layer 33A to a top surface of a respective one of the first conductive lines, wherein a top surface of each pillar stack structure (61, 62, 63, 64, 65) has a greater area than a bottom surface of each pillar stack structure (61, 62, 63, 64, 65), and wherein each pillar stack structure (61, 62, 63, 64, 65) comprises a set of vertically-stacked material portions that includes a respective lower pillar structure and a respective upper pillar structure, wherein one of the respective lower pillar structure and the respective upper pillar structure comprises a selector material pillar 62 exhibiting a non-linear switching characteristic and another of the respective lower pillar structure and the respective upper pillar structure comprises a memory material pillar 64 comprising a memory material; and second conductive lines (such as third metal lines 43L) laterally extending along a second horizontal direction hd2 that is different from the first horizontal direction hd1 and embedded in a second dielectric material layer 33B and contacting a respective column of pillar stack structures (61, 62, 63, 64, 65) selected from the two-dimensional array of pillar stack structures (61, 62, 63, 64, 65).

In one embodiment, each straight retro-tapered sidewall has a uniform retro-taper angle from the top surface of the via-level dielectric material layer 33A to the top surface of the respective one of the first conductive lines; and the uniform retro-taper angle is in a range from 0.1 degree to 10 degrees.

In one embodiment, each of the selector material pillars 62 comprises, and/or consists essentially of, one of: an ovonic threshold switch material; a conductive bridge structure; and a multilayer tunneling barrier stack structure.

In one embodiment, each of the memory material pillars 64 comprises a material selected from a phase change memory material and an oxygen vacancy-modulated resistive material.

In one embodiment, each pillar stack structure (61, 62, 63, 64, 65) comprises a respective intermediate barrier material plate 63 located between the respective lower pillar structure and the respective upper pillar structure and comprising a diffusion barrier material that prevents intermixing of materials in the respective lower pillar structure and the respective upper pillar structure.

In one embodiment, each pillar stack structure (61, 62, 63, 64, 65) comprises at least one of (i.e., one or both of): a bottom barrier material plate 61 located between the respective lower pillar structure and the respective one of the first conductive lines; and a top barrier material plate 65 located between the respective upper pillar structure and a respective one of the second conductive lines.

The various embodiments of the present disclosure provide pillar stack structures (61, 62, 63, 64, 65) that may function as a selector-memory element in a two-dimensional cross-point array configuration. Each selector material pillar 62 ensures that only a memory material pillar 64 located within a selected pillar stack structure (61, 62, 63, 64, 65) is activated for programming or reading and that electrical current does not flow through memory material pillars 64 in half-selected pillar stack structures (61, 62, 63, 64, 65) that are connected to a selected word line 76 but not to a selected bit line 86, or are connected to the selected bit line 86 but not to the selected word line 76. The entirety of each pillar stack structure (61, 62, 63, 64, 65) is formed within a well-defined volume that is laterally bounded entirely by at least one straight sidewall, which may be a single sidewall (for example, in embodiments in which a via cavity 69 having a circular or oval horizontal cross-sectional shape) or a plurality of sidewalls (for example, in embodiments in which of a via cavity 69 having a polygonal horizontal cross-sectional shape or at least one straight sidewall and at least one curved sidewall in a horizontal cross-sectional shape). Because the volume of each via cavity 69 may be well controlled by controlling the thickness of the via-level dielectric material layer 33A, the shapes and lateral dimensions of openings in a two-dimensional array of openings in the photoresist layer in the pattern of the via cavities 69, and by the taper angle of the sidewalls of the via cavities, the lateral dimensions of each component within each pillar stack structure (61, 62, 63, 64, 65) may be precisely controlled, and variations in the electrical properties of the selector material pillars 62 and the memory material pillars 64 in the pillar stack structures (61, 62, 63, 64, 65) may be minimized and uniform electrical characteristics may be provided by the two-dimensional array of pillar stack structures (61, 62, 63, 64, 65). Further, sidewalls of the selector material pillars 62 and the memory material pillars 64 are not exposed to any anisotropic etch process, and compositional and structural damages to the selector material pillars 62 and the memory material pillars 64 may be minimized using the processing steps of the present disclosure. Thus, the various embodiments provide structures with no etch damage to the memory cell. In addition, the resulting structures have less profile size variation than similar structures formed using conventional methods. Moreover, due to the reduction in sidewall damage, the limitations placed on cell size scaling may be reduced as well. Moreover, the various embodiments provide a simplified process flow.

While the present disclosure is described using an embodiment in which a two-dimensional array of pillar stack structures (61, 62, 63, 64, 65) is formed in an upper portion of the second interconnect-level structure L2 and in the third interconnect-level structure L3, embodiments are expressly contemplated herein in which the two-dimensional array of pillar stack structures (61, 62, 63, 64, 65) is formed in an upper portion of an (N−1)-th interconnect-level structure L(N−1) and in the N-th interconnect-level structure LN, in which N is 1 or any integer greater than 2.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a memory device, comprising:
   forming a first conductive structure embedded in a first dielectric material layer over a top surface of a substrate;
   forming a via-level dielectric material layer comprising a via-level dielectric material over the first dielectric material layer;
   forming a via cavity through the via-level dielectric material layer over the first conductive structure, wherein at least one straight sidewall vertically extends from a top surface of the via-level dielectric material layer to a top surface of the first conductive structure;
   forming a pillar stack structure in the via cavity by sequentially forming a set of material portions comprising a lower pillar structure and an upper pillar structure, wherein one of the lower pillar structure and the upper pillar structure comprises a selector material pillar exhibiting a non-linear switching characteristic and another of the lower pillar structure and the upper pillar structure comprises a memory material pillar comprising a memory material; and forming a second conductive structure embedded in a second dielectric material layer on a top surface of the pillar stack structure.

2. The method of claim 1, wherein the lower pillar structure is formed by depositing and vertically recessing a lower pillar material.

3. The method of claim 2, wherein the lower pillar structure is formed by performing a selective deposition process that grows the lower pillar material within the via cavity from a top surface of an underlying material portion while suppressing growth of the lower pillar material from physically exposed surfaces of the via-level dielectric material layer.

4. The method of claim 2, wherein the lower pillar structure is formed by:
depositing the lower pillar material in the via cavity and over a top surface of the via-level dielectric material layer using a non-selective deposition process; and
vertically recessing the lower pillar material, wherein the lower pillar material is removed from above the top surface of the via-level dielectric material layer and from an upper volume of the via cavity.

5. The method of claim 1, wherein the upper pillar structure is formed by depositing and vertically recessing an upper pillar material.

6. The method of claim 5, wherein the upper pillar structure is formed by performing a selective deposition process that grows the upper pillar material within the via cavity from a top surface of an underlying material portion while suppressing growth of the upper pillar material from physically exposed surfaces of the via-level dielectric material layer.

7. The method of claim 5, wherein the upper pillar structure is formed by:
depositing the upper pillar material in the via cavity and over a top surface of the via-level dielectric material layer using a non-selective deposition process; and
vertically recessing the upper pillar material, wherein the upper pillar material is removed from above the top surface of the via-level dielectric material layer.

8. The method of claim 1, wherein the selector material pillar comprises one of:
an ovonic threshold switch material;
a conductive bridge structure; and
a multilayer tunneling barrier stack structure.

9. The method of claim 1, wherein the memory material pillar comprises a material selected from a phase change memory material and an oxygen vacancy-modulated resistive material.

10. The method of claim 1, further comprising forming an intermediate barrier material plate directly on a top surface of the lower pillar structure, wherein the upper pillar structure is formed directly on the top surface of the intermediate barrier material plate.

11. The method of claim 10, wherein the intermediate barrier material plate is formed by a selective barrier material deposition process that grows a barrier material from the top surface of the lower pillar structure while suppressing growth of the barrier material from a top surface or a sidewall of the via-level dielectric material layer.

12. The method of claim 10, wherein the intermediate barrier material plate is formed by performing an anisotropic deposition that deposits a barrier material with a greater thickness on horizontal surfaces than on vertical surfaces, and by isotropically etching vertically-extending portions of the barrier material from a sidewall of the via-level dielectric material layer.

13. A method of forming a memory device, comprising:
forming first conductive lines that are parallel to one another and embedded in a first dielectric material layer over a top surface of a substrate;
forming a via-level dielectric material layer comprising a via-level dielectric material over the first dielectric material layer;
forming a two-dimensional array of via cavities through the via-level dielectric material layer, wherein each row of via cavities within the two-dimensional array is formed over a respective one of the first conductive lines;
forming a two-dimensional array of pillar stack structures in the two-dimensional array of via cavities, wherein each set of material portions comprises a respective lower pillar structure and a respective upper pillar structure that are formed by depositing and vertically recessing a respective material within a respective one of the via cavities, wherein one of the respective lower pillar structure and the respective upper pillar structure comprises a selector material pillar exhibiting a non-linear switching characteristic and another of the respective lower pillar structure and the respective upper pillar structure comprises a memory material pillar comprising a memory material; and
forming second conductive lines that are parallel to one another, laterally extending along a different direction than a lengthwise direction of the first conductive lines, and embedded in a second dielectric material layer on a respective column of pillar stack structures selected from the two-dimensional array of pillar stack structures.

14. The method of claim 13, wherein:
each of the selector material pillars comprises one of an ovonic threshold switch material, a conductive bridge structure, and a multilayer tunneling barrier stack structure; and
each of the memory material pillars comprises a material selected from a phase change memory material and an oxygen vacancy-modulated resistive material.

15. A memory device comprising:
first conductive lines laterally extending along a first horizontal direction and embedded in a first dielectric material layer located over a top surface of a substrate;
a via-level dielectric material layer comprising a via-level dielectric material and located over the first dielectric material layer;
a two-dimensional array of pillar stack structures embedded in the via-level dielectric material layer, wherein each row of pillar stack structures contacts a respective one of the first conductive lines, and each pillar stack structure within the two-dimensional array of pillar stack structures comprises at least one straight retro-tapered sidewall that vertically extends from a top surface of the via-level dielectric material layer to a top surface of a respective one of the first conductive lines, wherein a top surface of each pillar stack structure has a greater area than a bottom surface of each pillar structure, and wherein each pillar structure comprises a set of vertically-stacked material portions that includes a respective lower pillar structure and a respective upper pillar structure, wherein one of the respective lower pillar structure and the respective upper pillar structure comprises a selector material pillar exhibiting a non-linear switching characteristic and another of the respective lower pillar structure and the respective upper pillar structure comprises a memory material pillar comprising a memory material; and second conductive lines laterally extending along a second horizontal direction that is different from the first horizontal direction and embedded in a second dielectric material layer and contacting a respective column of pillar stack structures selected from the two-dimensional array of pillar stack structures.

16. The memory device of claim 15, wherein:

each straight retro-tapered sidewall has a uniform retro-taper angle from the top surface of the via-level dielectric material layer to the top surface of the respective one of the first conductive lines; and the uniform retro-taper angle is in a range from 0.1 degree to 10 degrees.

17. The memory device of claim 15, wherein each of the selector material pillars comprises one of:

an ovonic threshold switch material;

a conductive bridge structure; and a multilayer tunneling barrier stack structure.

18. The memory device of claim 15, wherein each of the memory material pillars comprises a material selected from a phase change memory material and an oxygen vacancy-modulated resistive material.

19. The memory device of claim 15, wherein each pillar stack structure comprises a respective intermediate barrier material plate located between the respective lower pillar structure and the respective upper pillar structure and comprising a diffusion barrier material that prevents intermixing of materials in the respective lower pillar structure and the respective upper pillar structure.

20. The memory device of claim 15, wherein each pillar structure comprises at least one of:

a bottom barrier material plate located between the respective lower pillar structure and the respective one of the first conductive lines; and a top barrier material plate located between the respective upper pillar structure and a respective one of the second conductive lines.

* * * * *